United States Patent
Hartley

(10) Patent No.: US 10,937,623 B2
(45) Date of Patent: Mar. 2, 2021

(54) DEFLECTOR FOR MULTIPLE ELECTRON BEAMS AND MULTIPLE BEAM IMAGE ACQUIRING APPARATUS

(71) Applicants: NuFlare Technology, Inc., Yokohama (JP); NuFlare Technology America, Inc., Sunnyvale, CA (US)

(72) Inventor: John Hartley, Stormville, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 16/419,564

(22) Filed: May 22, 2019

(65) Prior Publication Data

US 2019/0378676 A1 Dec. 12, 2019

Related U.S. Application Data

(60) Provisional application No. 62/681,934, filed on Jun. 7, 2018.

(51) Int. Cl.
*H01J 37/04* (2006.01)
*G01N 23/2251* (2018.01)
*H01J 37/28* (2006.01)

(52) U.S. Cl.
CPC ........ *H01J 37/045* (2013.01); *G01N 23/2251* (2013.01); *H01J 37/28* (2013.01); *H01J 2237/0435* (2013.01); *H01J 2237/04926* (2013.01); *H01J 2237/15* (2013.01); *H01J 2237/2446* (2013.01)

(58) Field of Classification Search
CPC .. H01J 37/045; H01J 37/28; H01J 2237/0435; H01J 2237/04926; H01J 2237/15; H01J 2237/2446; G01N 23/2251
See application file for complete search history.

(56) References Cited

U.S. PATENT DOCUMENTS

| | | |
|---|---|---|
| 8,362,425 B2 | 1/2013 | Han et al. |
| 2007/0164217 A1 | 7/2007 | Kanematsu |

FOREIGN PATENT DOCUMENTS

| | | |
|---|---|---|
| KR | 10-2018-0012723 A | 2/2018 |
| TW | 200700717 | 1/2007 |

OTHER PUBLICATIONS

Mankos, M., et al., "A Monochromatic, Aberration-Corrected, Dual-Beam Low Energy Electron Microscope", Ultramicroscopy, vol. 130, Jul. 2013, pp. 1-43.

(Continued)

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

A deflector for multiple electron beams includes a first electrode substrate, second to fourth electrode substrates disposed in order in parallel to each other in a first same plane which is orthogonal to the substrate surface of the first electrode substrate, a fifth electrode substrate disposed opposite to the first electrode substrate, and sixth to eighth electrode substrates disposed in order in parallel to each other in a second same plane such that they are opposite to the second to fourth electrode substrates, wherein the first to eighth electrode substrates are disposed such that they surround a space through which multiple electron beams pass.

10 Claims, 15 Drawing Sheets

(56) References Cited

OTHER PUBLICATIONS

Enyama. M., et al., "Optical system for a multiple-beam scanning electron microscope", Journal of Vacuum Science & Technology B, vol. 32 No. 5, Sep./Oct. 2014, pp. 051801-1-051801-6 with cover page.

Miyoshi, M., et al., "Development of a projection Imaging electron Microscope with electrostatic lenses", Journal of Vacuum Science & Technology B, vol. 17 No. 6, Nov./Dec. 1999, pp. 2799-2802 with cover page.

Combined Taiwanese Office Action and Search Report dated Aug. 10, 2020 in Patent Application No. 108115232 (with English language machine translation), 9 pages.

Office Action dated Sep. 7, 2020 in corresponding Korean Patent Application No. 10-2019-0056825 (with English Translation), citing documents therein, 6 pages.

| | 1 | 2 | 3 | 4 | 5 | 6 | 7 | 8 |
|---|---|---|---|---|---|---|---|---|
| A1x | 1 | $\frac{1}{\sqrt{2}}$ | 0 | $-\frac{1}{\sqrt{2}}$ | −1 | $-\frac{1}{\sqrt{2}}$ | 0 | $\frac{1}{\sqrt{2}}$ |
| A1y | 0 | $\frac{1}{\sqrt{2}}$ | 1 | $\frac{1}{\sqrt{2}}$ | 0 | $-\frac{1}{\sqrt{2}}$ | −1 | $-\frac{1}{\sqrt{2}}$ |
| D1x | 1 | $\frac{1}{\sqrt{2}}$ | 0 | $-\frac{1}{\sqrt{2}}$ | −1 | $-\frac{1}{\sqrt{2}}$ | 0 | $\frac{1}{\sqrt{2}}$ |
| D1y | 0 | $\frac{1}{\sqrt{2}}$ | 1 | $\frac{1}{\sqrt{2}}$ | 0 | $-\frac{1}{\sqrt{2}}$ | −1 | $-\frac{1}{\sqrt{2}}$ |
| S1 θ1 | S1· cos(2θ1) | S1· sin(2θ1) | −S1· cos(2θ1) | −S1· sin(2θ1) | S1· cos(2θ1) | S1· sin(2θ1) | −S1· cos(2θ1) | −S1· sin(2θ1) |
| f1 | 1 | 1 | 1 | 1 | 1 | 1 | 1 | 1 |

$$V_{12} = \frac{(A_{1x} + A_{1y} + D_{1x} + D_{1y})}{\sqrt{2}} + S_1 \sin(2\theta_1) + f_1$$

FIG.7

| | 2 | | | | | | | |
|---|---|---|---|---|---|---|---|---|
| | 1 | 2 | 3 | 4 | 5 | 6 | 7 | 8 |
| A2x | 1 | $\frac{1}{\sqrt{2}}$ | 0 | $-\frac{1}{\sqrt{2}}$ | -1 | $-\frac{1}{\sqrt{2}}$ | 0 | $\frac{1}{\sqrt{2}}$ |
| A2y | 0 | $\frac{1}{\sqrt{2}}$ | 1 | $\frac{1}{\sqrt{2}}$ | 0 | $-\frac{1}{\sqrt{2}}$ | -1 | $-\frac{1}{\sqrt{2}}$ |
| D2x | 1 | $\frac{1}{\sqrt{2}}$ | 0 | $-\frac{1}{\sqrt{2}}$ | -1 | $-\frac{1}{\sqrt{2}}$ | 0 | $-\frac{1}{\sqrt{2}}$ |
| D2y | 0 | $\frac{1}{\sqrt{2}}$ | 1 | $\frac{1}{\sqrt{2}}$ | 0 | $-\frac{1}{\sqrt{2}}$ | -1 | $-\frac{1}{\sqrt{2}}$ |
| S2·θ2 | $S2·\cos(2\theta2)$ | $S2·\sin(2\theta2)$ | $-S2·\cos(2\theta2)$ | $-S2·\sin(2\theta2)$ | $S2·\cos(2\theta2)$ | $S2·\sin(2\theta2)$ | $-S2·\cos(2\theta2)$ | $-S2·\sin(2\theta2)$ |
| f2 | 1 | 1 | 1 | 1 | 1 | 1 | 1 | 1 |

$$V_{22} = \frac{(A_{2x} + A_{2y} + D_{2x} + D_{2y})}{\sqrt{2}} + S_2\sin(2\theta_2) + f_2$$

FIG.8

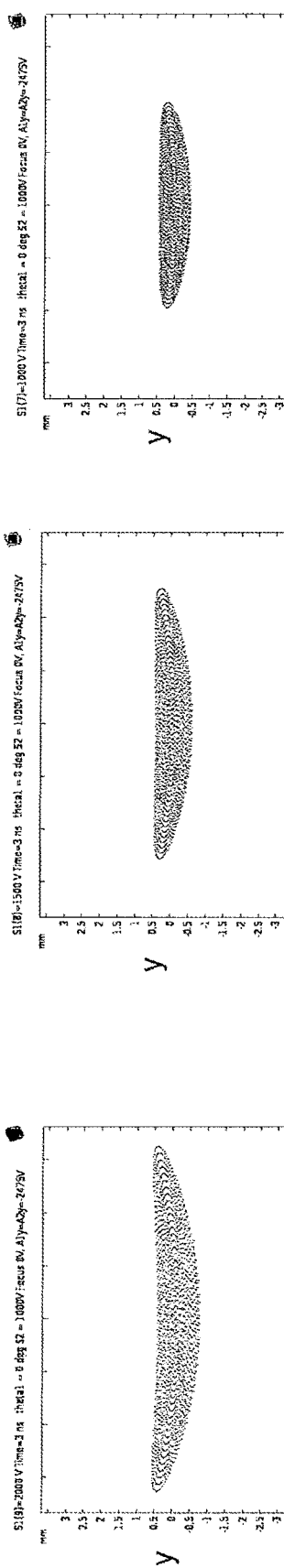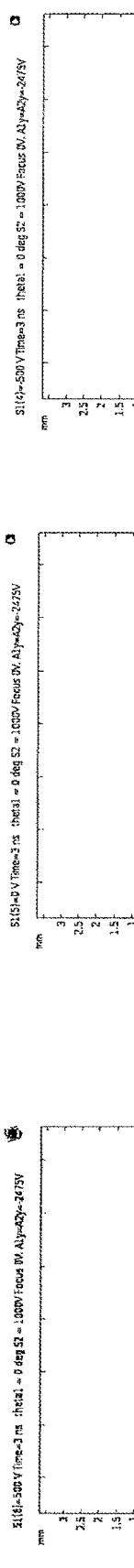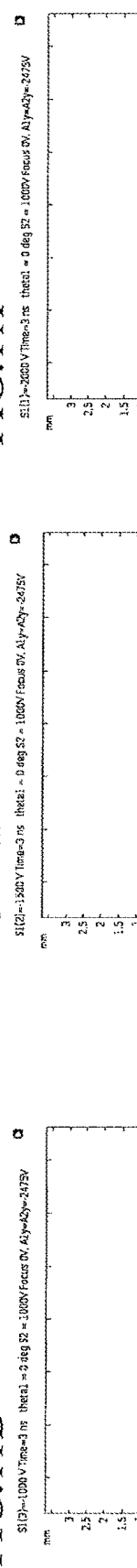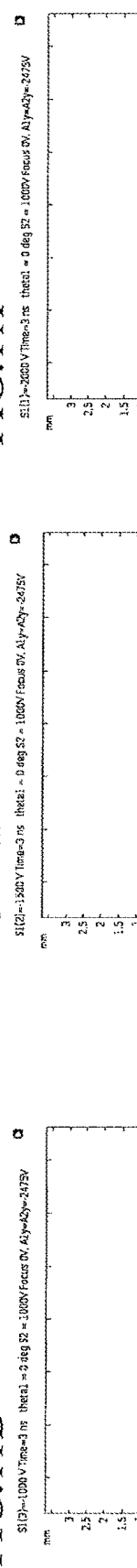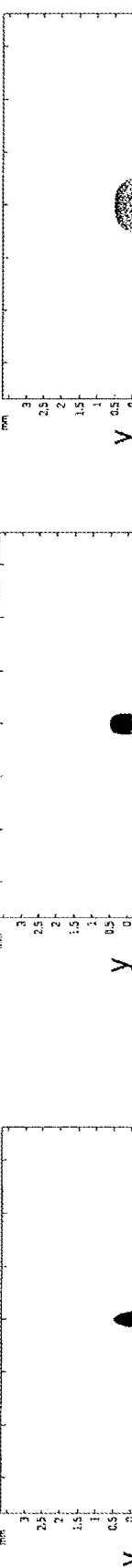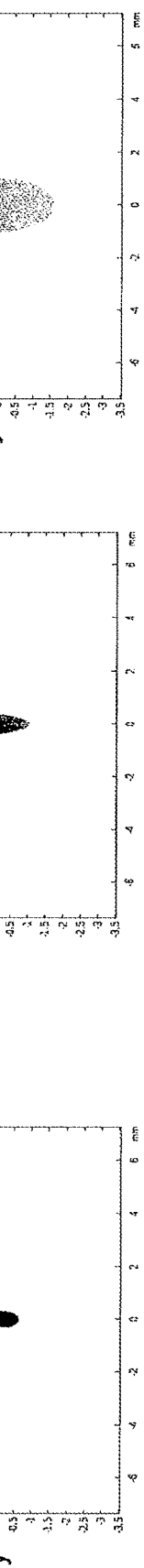
FIG.11A  FIG.11B  FIG.11C
FIG.11D  FIG.11E  FIG.11F
FIG.11G  FIG.11H  FIG.11I

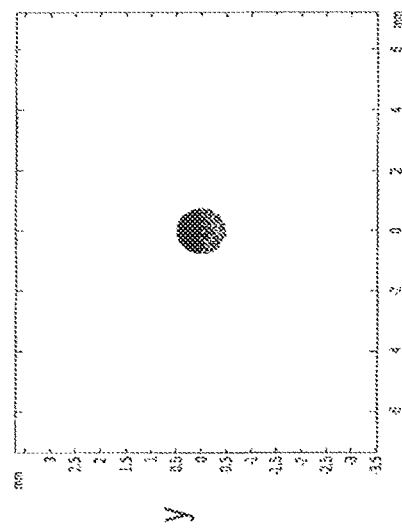
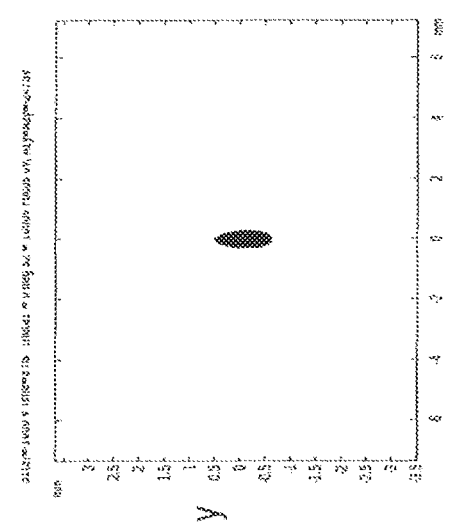
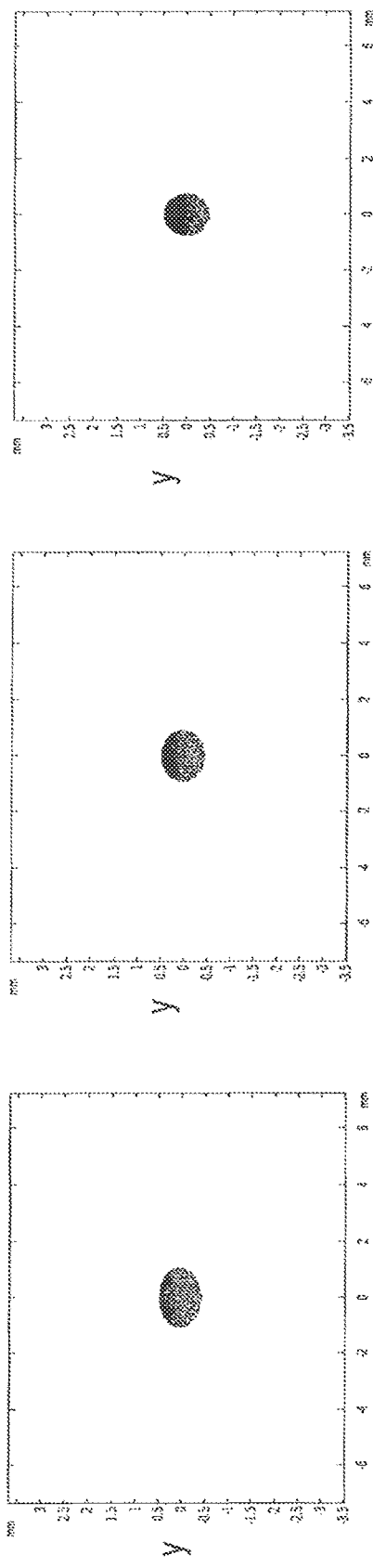
FIG.12A  FIG.12B  FIG.12C
FIG.12D  FIG.12E  FIG.12F
S1: -500→-1000V, theta1=0

DEFLECTOR FOR MULTIPLE ELECTRON BEAMS AND MULTIPLE BEAM IMAGE ACQUIRING APPARATUS

CROSS-REFERENCE TO RELATED APPLICATION

This application is based upon and claims the benefit of priority from prior Provisional Patent Application No. 62/681,934 filed on Jun. 7, 2018 in U.S.A., the entire contents of which are incorporated herein by reference.

BACKGROUND OF THE INVENTION

Field of the Invention

Embodiments of the present invention relate to a deflector for multiple electron beams and a multiple beam image acquiring apparatus. For example, embodiments of the present invention relate to an inspection apparatus for inspecting a pattern by acquiring a secondary electron image of the pattern emitted by irradiation with electron multiple beams.

Description of Related Art

In recent years, with the advance of high integration and large capacity of LSI (Large Scale Integration or Integrated circuit), the line width (critical dimension) required for circuits of semiconductor elements is becoming increasingly narrower. Since LSI manufacturing requires a tremendous amount of manufacturing cost, it is crucial to improve its yield. However, as typified by a 1-gigabit DRAM (Dynamic Random Access Memory), the scale of patterns configuring the LSI has become on the order of nanometers from submicrons. Also, in recent years, with miniaturization of dimensions of LSI patterns formed on a semiconductor wafer, dimension to be detected as a pattern defect has become extremely small. Therefore, the pattern inspection apparatus for inspecting defects of ultrafine patterns transferred and exposed on the semiconductor wafer needs to be highly accurate. Further, one of major factors that decrease the yield of the LSI manufacturing is due to pattern defects on the mask used for exposing and transferring an ultrafine pattern on a semiconductor wafer by the photolithography technology. Therefore, the pattern inspection apparatus for inspecting defects on a transfer mask used in manufacturing LSI needs to be highly accurate.

As an inspection method, there is known a method of comparing a measured image obtained by imaging a pattern formed on the substrate, such as a semiconductor wafer and a lithography mask, with design data or with another measured image obtained by imaging an identical pattern on the substrate. For example, the methods described below are known as pattern inspection, "die-to-die inspection" and "die-to-database inspection": the "die-to-die inspection" method compares data of measured images obtained by imaging identical patterns at different positions on the same substrate; and the "die-to-database inspection" method generates design image data (reference image), based on pattern design data, to be compared with a measured image serving as measured data obtained by imaging a pattern. Then, obtained images are transmitted as measured data to the comparison circuit. After providing alignment (positioning) between images, the comparison circuit compares the measured data with the reference data in accordance with an appropriate algorithm, and determines that there is a pattern defect if the compared data are not identical.

As the pattern inspection apparatus described above, in addition to the apparatus which irradiates the inspection substrate with laser beams in order to obtain a transmission image or a reflection image of a pattern formed on the substrate, there has been developed an inspection apparatus which acquires a pattern image by scanning the inspection substrate with primary electron beams and detecting secondary electrons emitted from the inspection substrate along with the irradiation by the electron beams. Further, as to the inspection apparatus using electron beams, the apparatus using multiple beams is also developed. When using multiple beams, it is necessary to separate multiple primary electron beams and multiple secondary electron beams, and to guide the multiple secondary electron beams to the detector. For example, multiple primary electron beams and multiple secondary electron beams are separated using a Wien filter (e.g., refer to, U.S. Pat. No. 8,362,425). Then, once the multiple primary electron beams and the multiple secondary electron beams are separated from each other, it may be necessary to perform additional operations for the multiple secondary electron beams, such as guiding the multiple secondary electron beams to the detector, cancelling out (compensating for) positional deviation due to scanning deflection, adjusting a focal point, correcting astigmatism, and the like. It is desired to achieve these functions by a mechanism as compact as possible while suppressing the aberration. Such a problem occurs not only with respect to the inspection apparatus, and may similarly occur with respect to the apparatus which acquires an image by using multiple beams.

BRIEF SUMMARY OF THE INVENTION

According to one aspect of the present invention, a deflector for multiple electron beams includes a first electrode substrate, second to fourth electrode substrates disposed in order in parallel to each other in a first same plane which is orthogonal to a substrate surface of the first electrode substrate, a fifth electrode substrate disposed opposite to the first electrode substrate, and sixth to eighth electrode substrates disposed in order in parallel to each other in a second same plane such that they are opposite to the second to fourth electrode substrates, wherein the first, second, third, fourth, fifth, sixth, seventh, and eighth electrode substrates are disposed such that they surround a space through which multiple electron beams pass.

According to another aspect of the present invention, a multiple beam image acquiring apparatus includes a primary optical system configured to irradiate multiple primary electron beams onto a substrate, a beam separator configured to separate, from the multiple primary electron beams, multiple secondary electron beams including reflected electrons, emitted from the substrate due to that the substrate is irradiated with the multiple primary electron beams, a detector configured to detect the multiple secondary electron beams having been separated, and a deflector for multiple electron beams configured to deflect the multiple secondary electron beams having been separated to a range which can be detected by the detector, wherein the deflector for multiple electron beams includes a first electrode substrate, second to fourth electrode substrates disposed in order in parallel to each other in a first same plane which is orthogonal to a substrate surface of the first electrode substrate, a fifth electrode substrate disposed opposite to the first electrode substrate, and sixth to eighth electrode substrates disposed in order in parallel to each other in a second same plane such that they are opposite to the second to fourth electrode substrates, wherein the first, second, third, fourth, fifth, sixth, seventh, and eighth electrode substrates are disposed such that they surround a space through which the multiple secondary electron beams pass.

BRIEF DESCRIPTION OF THE DRAWINGS

FIG. 7 shows a weight coefficient list of weight coefficients of potentials to be applied to the electrode substrates of the first stage deflector according to the first embodiment;

FIG. 8 shows a weight coefficient list of weight coefficients of potentials to be applied to the electrode substrates of the second stage deflector according to the first embodiment;

FIGS. 11A to 11I show other examples of a multiple secondary electron beam image after beam shape correction by the bending deflector according to the first embodiment;

FIGS. 12A to 12F show other examples of a multiple secondary electron beam image after beam shape correction by the bending deflector according to the first embodiment;

DETAILED DESCRIPTION OF THE INVENTION

Embodiments below describe a multiple electron beam inspection apparatus as an example of a multiple electron beam image acquiring apparatus. The multiple electron beam image acquiring apparatus is not limited to the inspection apparatus, and may be an apparatus irradiating multiple electron beams so as to acquire an image, for example.

First Embodiment

Figure 1:
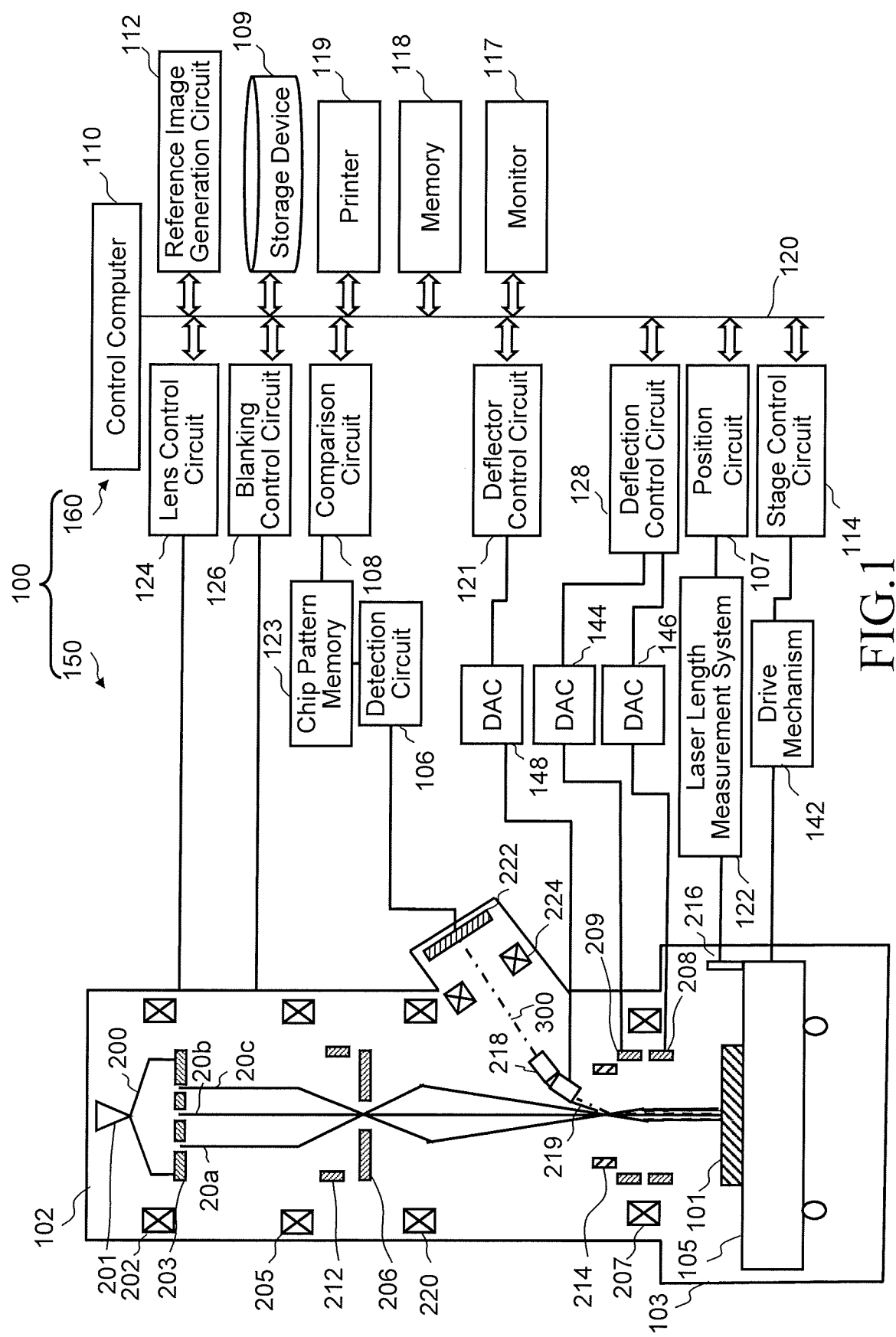
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of a multiple electron beam inspection apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, and a laser length measuring system 122. In the electron beam column 102, there are arranged an electron gun 201, an illumination lens 202, a shaping aperture array substrate 203, an electromagnetic lens 205, a common blanking deflector 212, a limiting aperture substrate 206, an electromagnetic lens 220, a beam separator 214, an objective lens 207, a main deflector 208, a sub deflector 209, a bending deflector 218 (deflector for multiple electron beams), a projection lens 224, and a multi-detector 222.

In the inspection chamber 103, there is arranged an XY stage 105 movable at least in the x-y plane. On the XY stage 105, there is placed a substrate 101 (target object) to be inspected. The substrate 101 may be an exposure mask substrate, or a semiconductor substrate such as a silicon wafer. When the substrate 101 is a semiconductor substrate, a plurality of chip patterns (wafer die) is formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed (transferred) onto the semiconductor substrate a plurality of times, a plurality of chip patterns (wafer die) is formed on the semiconductor substrate. Hereinafter, the case of the substrate 101 being a semiconductor substrate is mainly described below. The substrate 101 is placed with its pattern forming surface facing upward, on the XY stage 105, for example. Moreover, on the XY stage 105, there is arranged a mirror 216 which reflects a laser beam for measuring a laser length emitted from the laser length measuring system 122 arranged outside the inspection chamber 103. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a deflector control circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144 and 146. The DAC amplifier 146 is connected to the main deflector 208, and the DAC amplifier 144 is connected to the sub deflector 209. Moreover, the deflector control circuit 121 is connected to a DAC amplifier 148. The DAC amplifier 148 is connected to the bending deflector 218.

The chip pattern memory 123 is connected to the comparison circuit 108. The XY stage 105 is driven by the drive mechanism 142 under the control of the stage control circuit 114. In the drive mechanism 142, the XY stage 105 can be moved by a drive system, such as a three (x-, y-, and θ-) axis motor, for example, which moves in the directions of x, y, and θ in the stage coordinate system. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the X, Y, and θ directions are set with respect to a plane orthogonal to the optical axis of the multiple primary electron beams, for example.

The common blanking deflector 212 is composed of electrodes of at least two poles, and controlled by the blanking control circuit 126. The main deflector 208 is composed of electrodes of at least four poles, and controlled by the deflection control circuit 128 through the DAC amplifier 146 arranged for each electrode. Similarly, the sub deflector 209 is also composed of electrodes of at least four poles, and controlled by the deflection control circuit 128 through the DAC amplifier 144 arranged for each electrode. Similarly, the bending deflector 218 is configured by a two-stage deflector where each stage is composed of electrodes of at least eight poles, and each electrode is controlled by the deflector control circuit 121 through the DAC amplifier 148.

FIG. 1 shows configuration elements necessary for describing the first embodiment. It should be understood that other configuration elements generally necessary for the inspection apparatus 100 may also be included therein.

Figure 2:
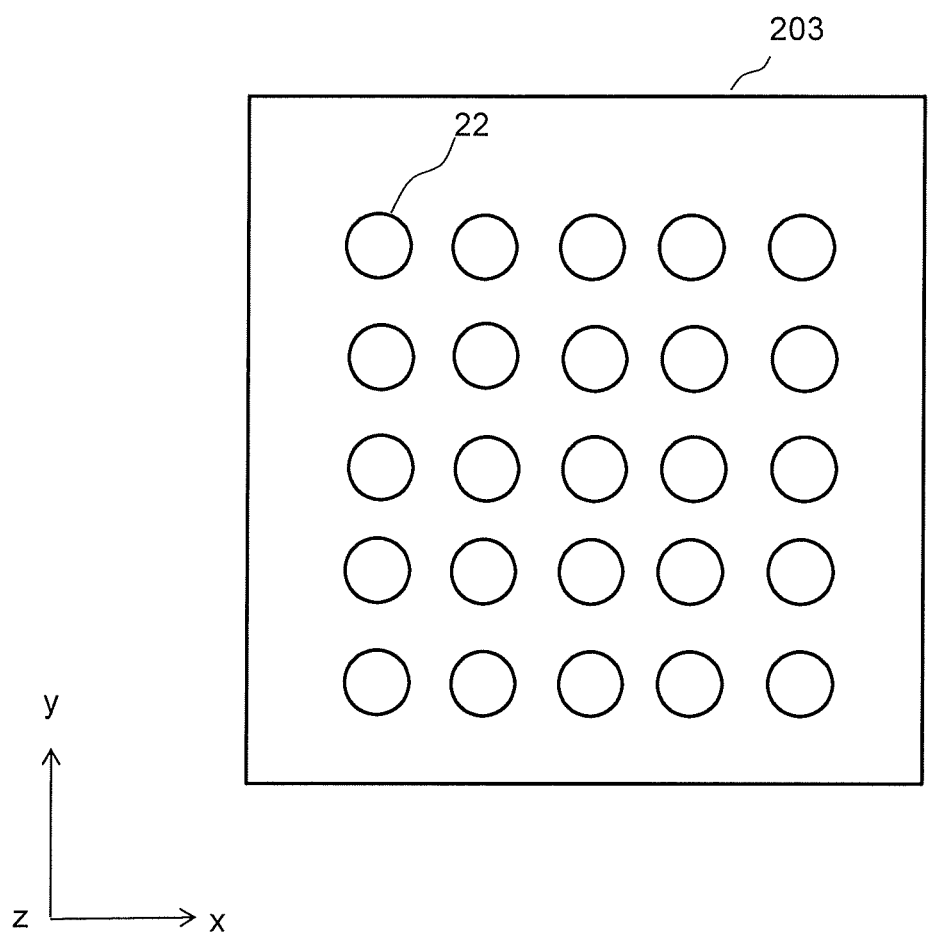
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (x direction) and $n_1$ rows long (y direction) are two-dimensionally formed at a predetermined arrangement pitch in the shaping aperture array substrate 203, where $m_1$ and $n_1$ are integers of 2 or greater. In the case of FIG. 2, holes 22 of 5 (columns in x direction)×5 (rows in y direction) are formed. The arrangement number of the holes 22 is not limited thereto. Each of the holes 22 is a circle with the same outer diameter. Alternatively, each of the holes 22 may be a quadrangle (rectangle) having the same dimension, shape, and size. The multiple beams 20 are formed by letting portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b".

Next, operations of the image acquisition mechanism 150 in the inspection apparatus 100 are described below.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of holes 22 (openings) are formed in the shaping aperture array substrate 203. The region including all the plurality of holes 22 is irradiated by the electron beam 200. For example, a plurality of electron beams (multiple primary electron beams) 20a to 20c (solid lines in FIG. 1) are formed by letting portions of the electron beam 200, which irradiate the positions of a plurality of holes 22, individually pass through a corresponding one of the plurality of holes 22 in the shaping aperture array substrate 203.

The formed multiple primary electron beams 20a to 20c are refracted toward the center hole of the limiting aperture substrate 206 by the electromagnetic lens 205. In other words, when receiving the incident multiple primary electron beams 20, the electromagnetic lens 205 refract them. Here, the electromagnetic lens 205 refracts the multiple primary electron beams 20a to 20c such that the focus position of each beam is located at the position of the center hole of the limiting aperture substrate 206. At this stage, when all of the multiple primary electron beams 20a to 20c are collectively deflected by the common blanking deflector 212, they deviate from the center hole of the limiting aperture substrate 206 so as to be blocked by the limiting aperture substrate 206. On the other hand, when the multiple primary electron beams 20a to 20c are not deflected by the common blanking deflector 212, they pass through the center hole of the limiting aperture substrate 206 as shown in FIG. 1. Blanking control is provided by ON/OFF of the common blanking deflector 212 to collectively control ON/OFF of the multiple primary electron beams. Thus, the limiting aperture substrate 206 blocks the multiple primary electron beams 20a to 20c which were deflected to be in the OFF condition by the common blanking deflector 212. Then, the multiple primary electron beams 20a to 20c for inspection are formed by the beams having been made during a period from becoming "beam ON" to becoming "beam OFF" and having passed through the limiting aperture substrate 206.

The multiple primary electron beams 20 having passed through the limiting aperture substrate 206 go to the electromagnetic lens 220. Receiving the incident multiple primary electron beams 20, the electromagnetic lens 220 refracts them. The multiple primary electron beams 20 form a crossover (C.O.) by the electromagnetic lens 220. After passing through the beam separator 214 arranged at the position of the crossover, the multiple beams 20 are focused on the substrate 101 (target object) by the objective lens 207 to be a pattern image (beam diameter) of a desired reduction ratio. Then, the whole multiple primary electron beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple primary electron beams 20. According to the first embodiment, scanning is performed while continuously moving the XY stage 105, for example. Therefore, the main deflector 208 performs tracking deflection to follow the movement of the XY stage 105. Then, the sub deflector 209 collectively deflects all of the multiple primary electron beams 20 so that each beam may scan a corresponding region. Ideally, the multiple primary electron beams 20 irradiating at a time are aligned at the pitch obtained by multiplying the arrangement pitch of a plurality of holes 22 in the shaping aperture array substrate 203 by a desired reduction ratio (1/a). Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple primary electron beams 20, is emitted from the substrate 101 due to that desired positions on the substrate 101 are irradiated with the multiple primary electron beams 20.

The multiple secondary electron beams 300 emitted from the substrate 101 are refracted toward their center by the objective lens 207, and advance toward the beam separator 214 arranged at the crossover position.

The beam separator 214 generates an electric field and a magnetic field to be orthogonal to each other in a plane orthogonal to the traveling direction (optical axis) of the center beam of the multiple beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of an electron. With respect to the multiple beams 20 (multiple primary electron beams) entering the beam separator 214 from the upper side, since the force due to the electric field and the force due to the magnetic field cancel each other out, the multiple beams 20 go straight downward. On the other hand, with respect to the multiple secondary electron beams 300 entering the beam separator 214 from the lower side, since both the force due to the electric field and the force due to the magnetic field are exerted in the same direction, the multiple secondary electron beams 300 are bent obliquely upward.

The multiple secondary electron beams 300 bent obliquely upward are further bent by the bending deflector 218 to travel to the projection lens 224. The multiple secondary electron beams 300 deflected by the bending deflector 218 are projected onto the multi-detector 222 while being refracted by the projection lens 224. The multi-detector 222 detects the projected multiple secondary electron beams 300. The multi-detector 222 includes a diode type two-dimensional sensor (not shown). Then, at the position of the diode type two-dimensional sensor corresponding to each of the multiple beams 20, each secondary electron of the multiple secondary electron beams 300 collides with the diode type two-dimensional sensor to produce an electron, and generate secondary electron image data for each pixel. Since scanning is performed while continuously moving the XY stage 105, tracking deflection is provided as described above. The bending deflector 218 cancels out (compensates for) the deviation of the receiving position of the multiple secondary electron beams 300 on the electron receiving surface of the multi-detector 222, which is caused by movement of the deflection positions of the multiple primary electron beams 20 along with the tracking deflection and scanning operation, and deflects the multiple secondary electron beams 300 so that they may irradiate respective desired positions on the electron receiving surface of the multi-detector 222. Then, the multi-detector 222 detects the multiple secondary electron beams 300. An image on the substrate 101 is formed by an intensity signal detected by the multi-detector 222.

Figure 3:
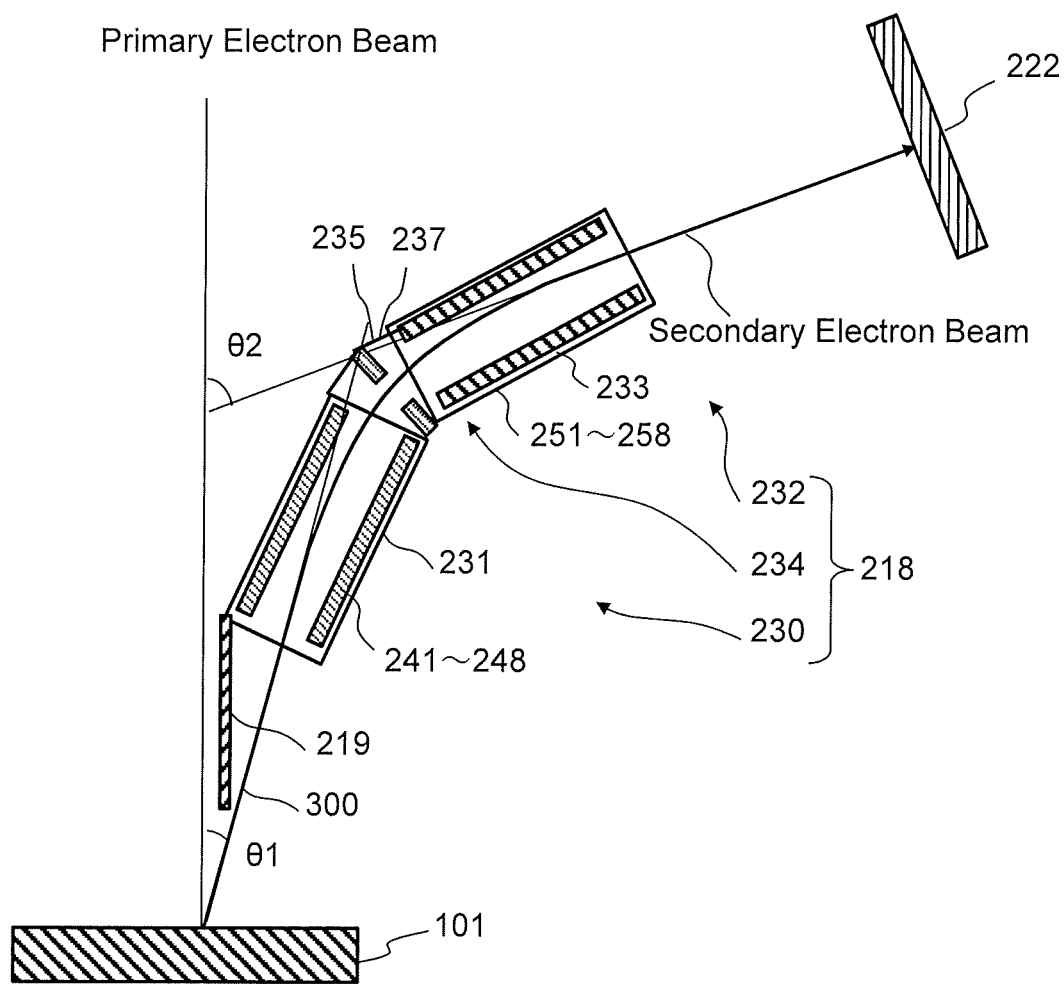
FIG. 3 shows a sectional view example of configuration of a bending deflector and its arrangement position.

FIG. 3 shows a sectional view example of configuration of a bending deflector and its arrangement position.

Figure 4:
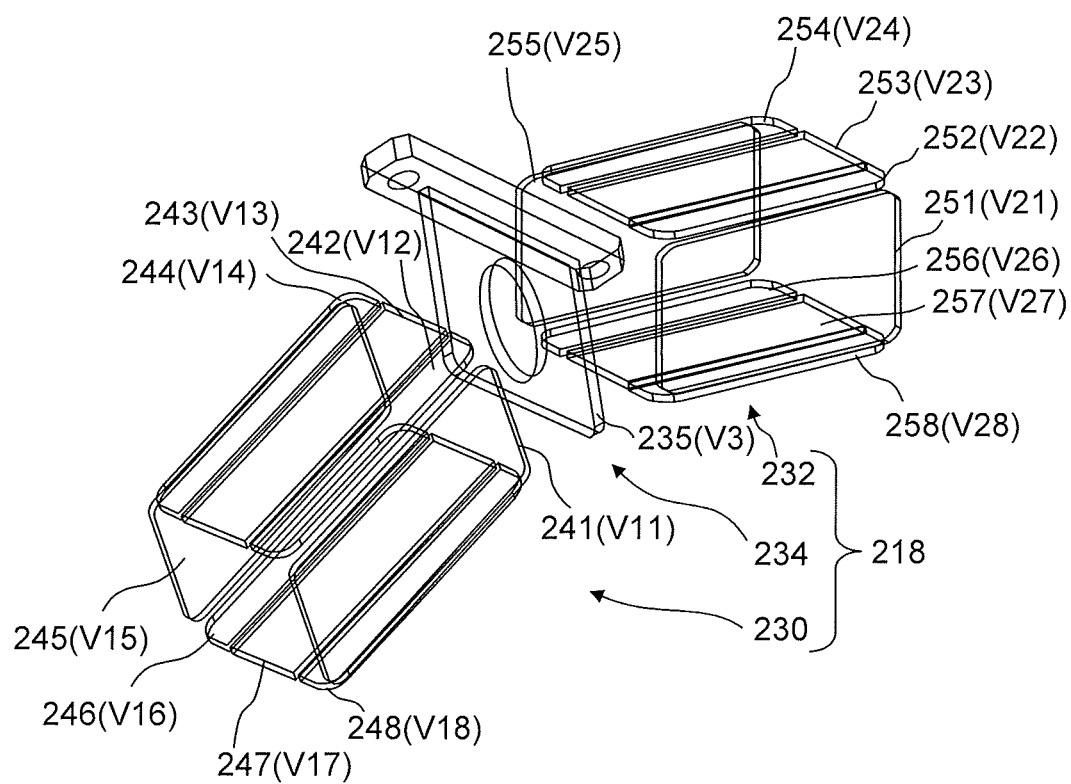
FIG. 4 shows a perspective view example of configuration of a bending deflector according to the first embodiment.

FIG. 4 shows a perspective view example of configuration of a bending deflector according to the first embodiment. In FIGS. 3 and 4, a bending deflector 218 includes two-stage deflectors 230 and 232. In a first stage deflector 230 (first deflector), there are arranged electrode substrates 241, 242, 243, 244, 245, 246, 247, and 248 of eight poles inside a housing 231 optionally made of magnetic material if required for shielding. In a second stage deflector 232 (second deflector), there are arranged electrode substrates 251, 252, 253, 254, 255, 256, 257, and 258 of eight poles inside a housing 233 optionally made of magnetic material if required for shielding. The first stage deflector 230 and the second stage deflector 232 are connected to each other with different angles. Specifically, the first stage deflector 230 with an angle in the direction different from the direction in which the first stage deflector 230 bends the beam trajectory of the multiple secondary electron beams 300, and the second stage deflector 232 with an angle in the direction different from the direction in which the second stage deflector 232 bends the beam trajectory of the multiple secondary electron beams 300 are connected to each other. In the case of FIG. 3, the multiple secondary electron beams 300, specifically, the trajectory center of the multiple secondary electron beams 300, enters the first stage deflector 230 at the angle θ1 with respect to the incident angle) (0°) of the trajectory center (optical axis) of the multiple primary electron beams 20 entering the substrate 101, and then, changes the angle at the exit of the first stage deflector 230 in order to enter the second stage deflector 232. Then, it exits from the second stage deflector 232 at the angle θ2. Specifically, the multiple secondary electron beams 300 enter the bending deflector 218 at, for example, 15° as the angle θ1, and they exit from the bending deflector 218 at, for example, 70° as the angle θ2. Therefore, the first stage deflector 230 and the second stage deflector 232 are connected with the angle difference (θ2-θ1), for example, 55°. However, the values of the angles θ1 and θ2 are not limited thereto. Other angles may be used. An intermediate electrode 234 is arranged between the first and second stage deflectors 230 and 232. In the intermediate electrode 234, an aperture electrode substrate 235 with an aperture, through which the multiple secondary electron beams 300 can pass, is arranged in a housing 237 optionally made of magnetic material if required for shielding. The housings 231, 235, and 237 may be formed in an integral structure.

Each of the electrode substrates 241 to 248 of the first stage deflector 230 is formed by a flat plate of conductive material. Preferably, each of the electrode substrates 241 to 248 is made of non-magnetic material which is difficult to oxidize. In the direction orthogonal to the substrate surface of the electrode substrate 241 (first electrode substrate), there are disposed the electrode substrate 242 (second electrode substrate), the electrode substrate 243 (third electrode substrate), and the electrode substrate 244 (fourth electrode substrate) in order in parallel to each other in the same plane (first same plane). The electrode substrate 245 (fifth electrode substrate) is disposed to be opposite to (facing) the electrode substrate 241 (first electrode substrate). Moreover, the electrode substrate 246 (sixth electrode substrate), the electrode substrate 247 (seventh electrode substrate), and the electrode substrate 248 (eighth electrode substrate) are disposed in order in parallel to each other in the same plane (second same plane) such that they are opposite to the electrode substrate 242, the electrode substrate 243, and the electrode substrate 244. The electrode substrates 241, 242, 243, 244, 245, 246, 247, and 248 of eight poles are disposed in this order such that they surround the space through which the multiple secondary electron beams 300 pass. The plane (same plane) composed of the electrode substrates 242, 243, and 244 forms the upper surface of the space through which the multiple secondary electron beams 300 pass. The plane (same plane) composed of the electrode substrates 246, 247, and 248 forms the lower surface of the space through which the multiple secondary electron beams 300 pass. The electrode substrate 241 forms one side surface of the space through which the multiple secondary electron beams 300 pass. The electrode substrate 245 forms the other side surface of the space through which the multiple secondary electron beams 300 pass. Thus, the section of the first stage deflector 230 is a rectangle. However, not being limited to a rectangle, the section of the first stage deflector 230 may be a regular octagon or a circular shape divided into eight equal parts. In particular, a rectangle makes it easy to manufacture.

With respect to the electrode substrates 242, 243, and 244 disposed in order in parallel to each other in the same plane of the first stage deflector 230, it is preferable that the width of the central electrode substrate 243 is formed to be wider than those of the electrode substrates 242 and 244 at the both sides. It is desirable that the central electrode substrate 243 is formed to be, for example, twice as wide as those of the electrode substrates 242 and 244 at the both sides. However, it is not limited to twice. Preferably, the width is adjusted for optimization. Similarly, with respect to the electrode substrates 246, 247, and 248 disposed in order in parallel to each other in the same plane, it is preferable that the width of the central electrode substrate 247 is formed to be wider than those of the electrode substrates 246 and 248 at the both sides. It is desirable that the central electrode substrate 247 is formed to be, for example, twice as wide as those of the electrode substrates 246 and 248 at the both sides. However, it is not limited to twice. Preferably, the width is adjusted for optimization.

Preferably, the width sizes of the opposite facing electrode substrates 242 and 248 of the first stage deflector 230 are the same. Similarly, preferably, the width sizes of the opposite facing electrode substrates 243 and 247 are the same. Preferably, the width sizes of the opposite facing electrode substrates 244 and 246 are the same. Preferably, the width sizes of the opposite facing electrode substrates 241 and 245 are the same.

Each of the electrode substrates 251 to 258 of the second stage deflector 232 is formed by a flat plate of conductive material. Preferably, each of the electrode substrates 251 to 258 is made of non-magnetic material which is difficult to oxidize. In the direction orthogonal to the substrate surface of the electrode substrate 251 (first electrode substrate), there are disposed the electrode substrate 252 (second electrode substrate), the electrode substrate 253 (third electrode substrate), and the electrode substrate 254 (fourth electrode substrate) in order in parallel to each other in the same plane (first same plane). The electrode substrate 255 (fifth electrode substrate) is disposed to be opposite to (facing) the electrode substrate 251 (first electrode substrate). Moreover, the electrode substrate 256 (sixth electrode substrate), the electrode substrate 257 (seventh electrode substrate), and the electrode substrate 258 (eighth electrode substrate) are disposed in order in parallel to each other in the same plane (second same plane) such that they are opposite to (facing) the electrode substrate 252, the electrode substrate 253, and the electrode substrate 254. The electrode substrates 251, 252, 253, 254, 255, 256, 257, and 258 of eight poles are disposed in this order such that they surround the space through which the multiple secondary electron beams 300 pass. The plane (same plane) composed of the electrode substrates 252, 253, and 254 forms the upper surface of the space through which the multiple secondary electron beams 300 pass. The plane (same plane) composed of the electrode substrates 256, 257, and 258 forms the lower surface of the space through which the multiple secondary electron beams 300 pass. The electrode substrate 251 forms one side surface of the space through which the multiple secondary electron beams 300 pass. The electrode substrate 255 forms the other side surface of the space through which the multiple secondary electron beams 300 pass. Thus, the section of the second stage deflector 232 is a rectangle. However, not being limited to a rectangle, the section of the second stage deflector 232 may be a regular octagon or a circular shape divided into eight equal parts. In particular, a rectangle makes it easy to manufacture.

With respect to the electrode substrates 252, 253, and 254 disposed in order in parallel to each other in the same plane of the second stage deflector 232, it is preferable that the width of the central electrode substrate 253 is formed to be wider than those of the electrode substrates 252 and 254 at the both sides. It is desirable that the central electrode substrate 253 is formed to be, for example, twice as wide as those of the electrode substrates 252 and 254 at the both sides. However, it is not limited to twice. Preferably, the width is adjusted for optimization. Similarly, with respect to the electrode substrates 256, 257, and 258 disposed in order in parallel to each other in the same plane, it is preferable that the width of the central electrode substrate 257 is formed to be wider than those of the electrode substrates 256 and 258 at the both sides. It is desirable that the central electrode substrate 257 is formed to be, for example, twice as wide as those of the electrode substrates 256 and 258 at the both sides. However, it is not limited to twice. Preferably, the width is adjusted for optimization.

Preferably, the width sizes of the opposite facing electrode substrates 252 and 258 of the second stage deflector 232 are the same. Similarly, preferably, the width sizes of the opposite facing electrode substrates 253 and 257 are the same. Preferably, the width sizes of the opposite facing electrode substrates 254 and 256 are the same. Preferably, the width sizes of the opposite facing electrode substrates 251 and 255 are the same.

Since the electrode substrates 241 to 248 of the first stage deflector 230 are arranged in the housing 231 optionally made of a magnetic substance, it is possible to block the influence of the magnetic field from the electromagnetic lens if required. Similarly, since the electrode substrates 251 to 258 of the second stage deflector 232 are arranged in the housing 233 optionally made of a magnetic substance, it is possible to block the influence of the magnetic field from the electromagnetic lens if required. General note on the magnetic shielding of the bending deflector—it is preferable to locate it far away from magnetic components to avoid the need for shielding, but if that isn't possible, the housing and aperture can be made of magnetic material in order to shield the bending optics. Similarly, since the aperture electrode substrate 235 of the intermediate electrode 234 is arranged in the housing 237 (enclosure) made of magnetic substance, it is possible to block the influence of the magnetic field from the electromagnetic lens. For example, the magnetic field generated by the objective lens 207 and/or the beam separator 214 can be blocked. Thereby, each electrode substrate of the deflector 230, the deflector 232, and the intermediate electrode 234 can be shielded from the surrounding magnetic field. In other words, the housings 231, 233, and 237 function as magnetic shields. It is preferable to use magnetic material, such as low carbon steel to make the housings 231, 233, and 237.

A beam shield 219 is disposed as extending from the incident port of the first stage deflector 230 toward the substrate 101. In other words, the beam shield 219 (electric field shielding wall) is disposed as extending outwards from the entrance hole through which the multiple secondary electron beams 300 enter the space surrounded by the electrode substrates 241 to 248. The beam shield 219 is arranged at the trajectory side of the multiple primary electron beams 20. The beam shield 219 is formed by a metal flat plate, for example. However, it is not limited thereto. For example, a bent plate may be used. The beam shield 219 reduces or blocks the leakage of the electric field generated by the bending deflector 218 toward the multiple primary electron beams 20 side. Thereby, the multiple primary electron beams 20 can be protected. When the multiple primary electron beams 20 and the bending deflector 218 are disposed far from each other with a sufficient distance, it is not necessarily needed to arrange the beam shield 219.

Figure 5:
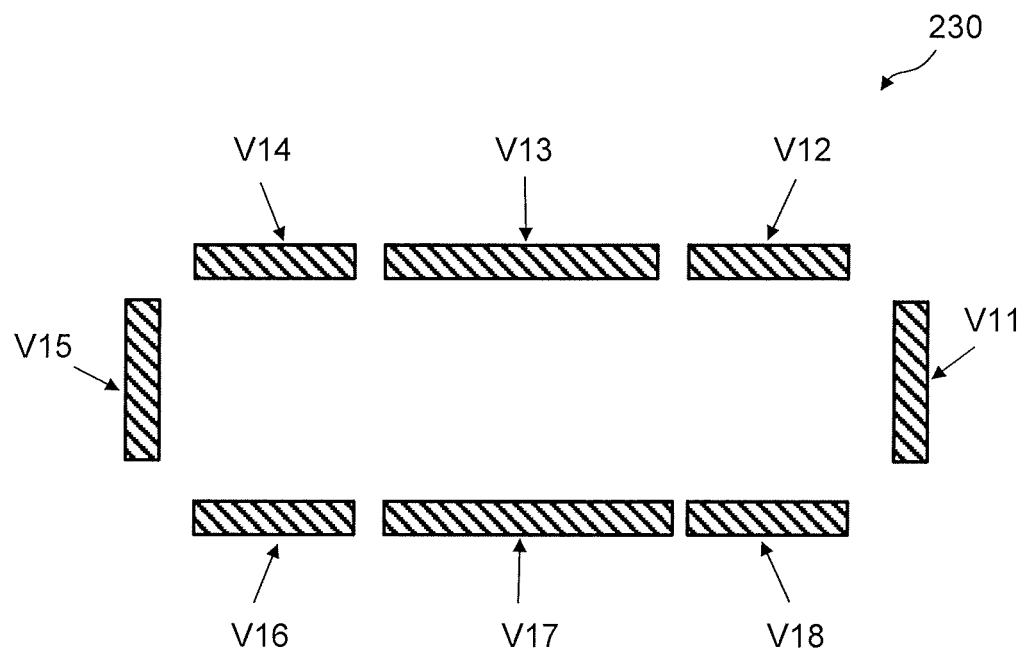
FIG. 5 illustrates an electric potential to be applied to each electrode substrate of the first stage deflector according to the first embodiment.

FIG. 5 illustrates an electric potential to be applied to each electrode substrate of the first stage deflector according to the first embodiment. In FIG. 5, a potential $V_{11}$ is applied to the electrode substrate 241 of the first stage deflector 230. A potential $V_{12}$ is applied to the electrode substrate 242. A potential $V_{13}$ is applied to the electrode substrate 243. A potential $V_{14}$ is applied to the electrode substrate 244. A potential $V_{15}$ is applied to the electrode substrate 245. A potential $V_{16}$ is applied to the electrode substrate 246. A potential $V_{17}$ is applied to the electrode substrate 247. A potential $V_{18}$ is applied to the electrode substrate 248. In the case where the designed trajectory center of the multiple secondary electron beams 300 passing through the inside of the first stage deflector 230 is in $z_1$ direction, the side of the electrode substrates 242, 243, and 244 is $+y_1$ direction in controlling deflection. Moreover, the side of the electrode substrates 246, 247, and 248 is $-y_1$ direction in controlling deflection. Further, the side of the electrode substrate 241 is $+x_1$ direction in controlling deflection. Furthermore, the side of the electrode substrate 245 is $-x_1$ direction in controlling deflection.

Figure 6:
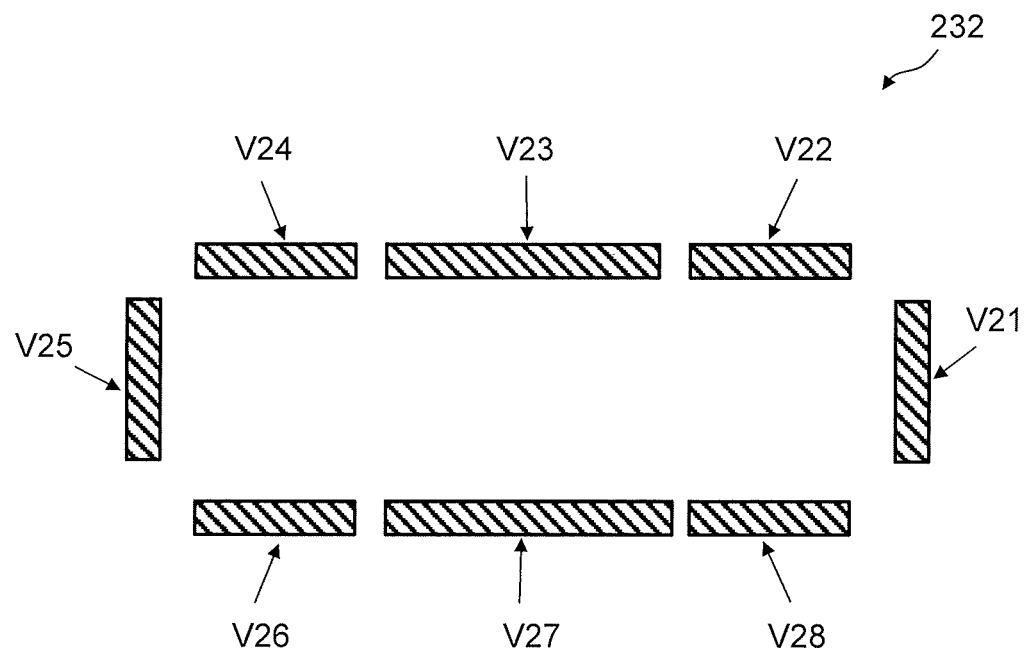
FIG. 6 illustrates an electric potential to be applied to each electrode substrate of the second stage deflector according to the first embodiment.
Figure 9C:
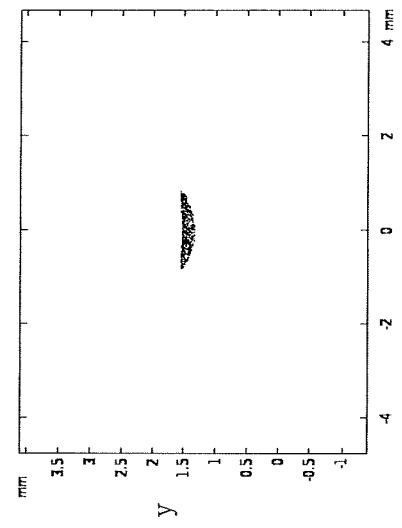
FIGS. 9A to 9E show examples of a multiple secondary electron beam image after beam deflection by a bending deflector according to the first embodiment.
Figure 9B:
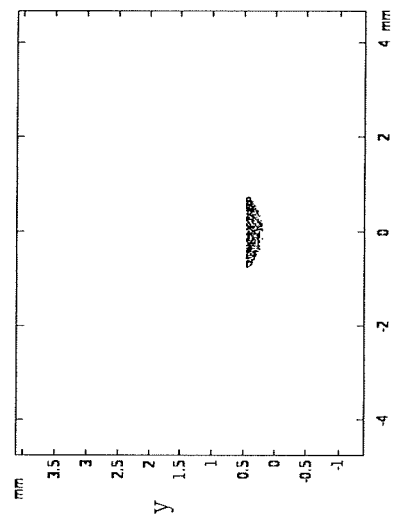
Figure 9A:
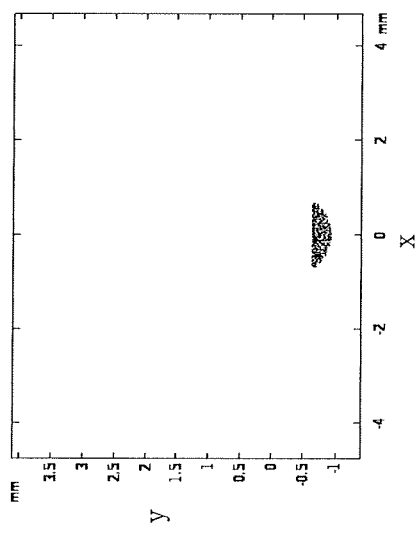
Figure 9E:
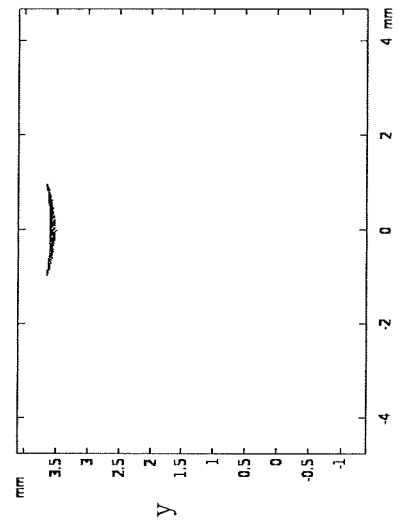
Figure 9D:
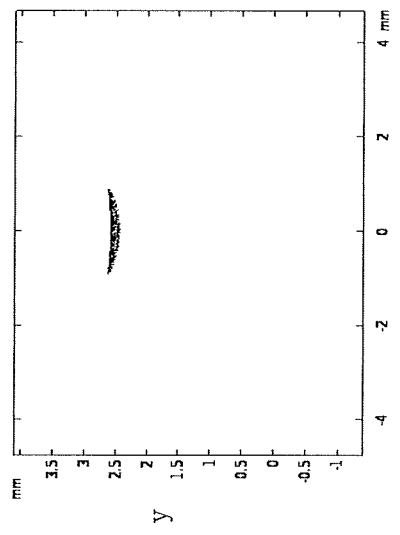
Figure 10A:
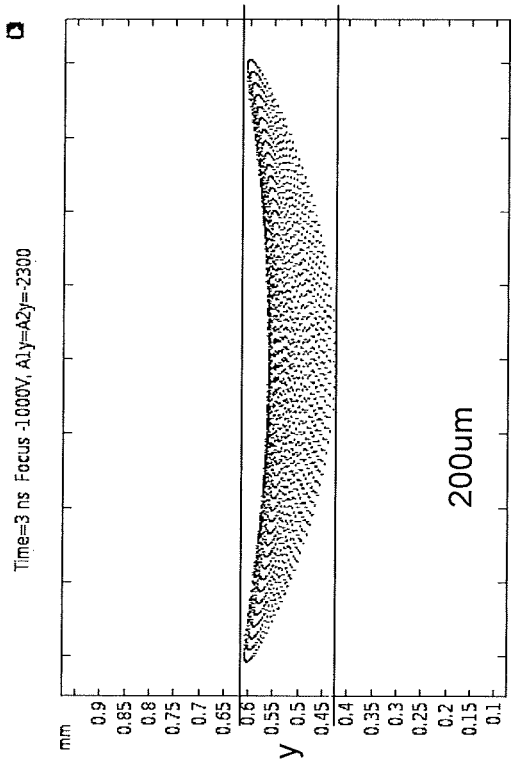
FIGS. 10A to 10D show examples of a multiple secondary electron beam image after beam shape correction by a bending deflector according to the first embodiment.
Figure 10C:
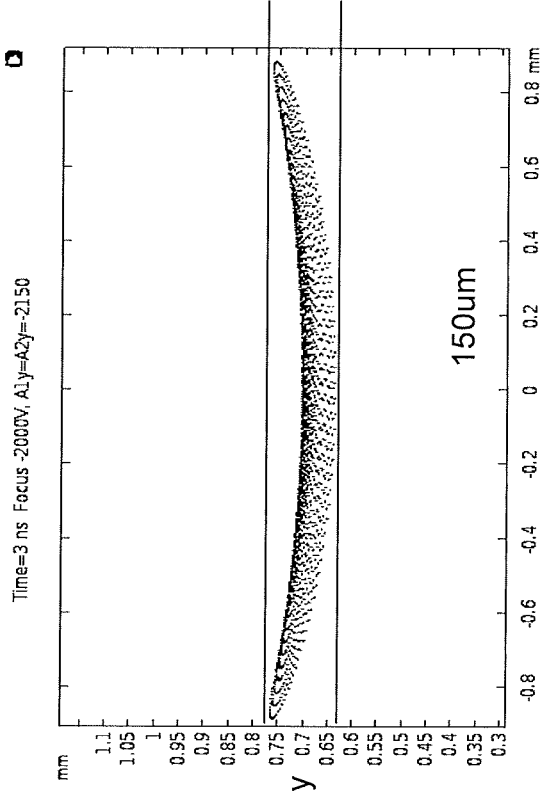
Figure 10B:
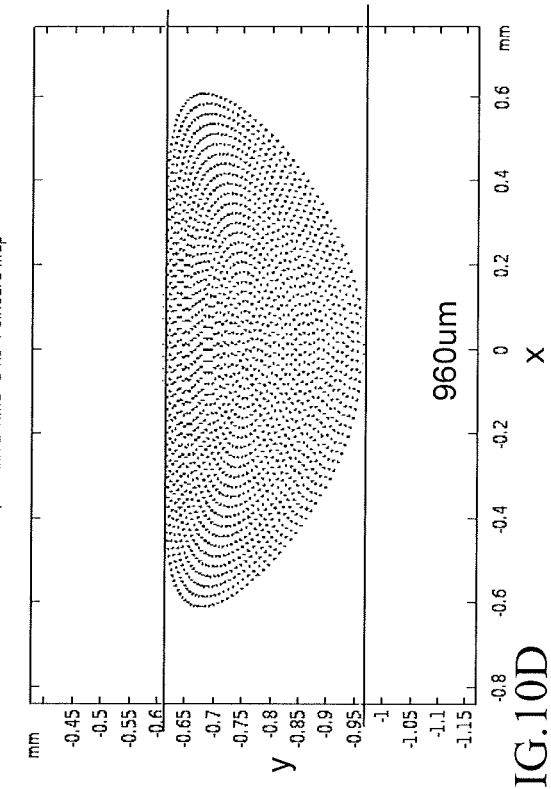
Figure 10D:
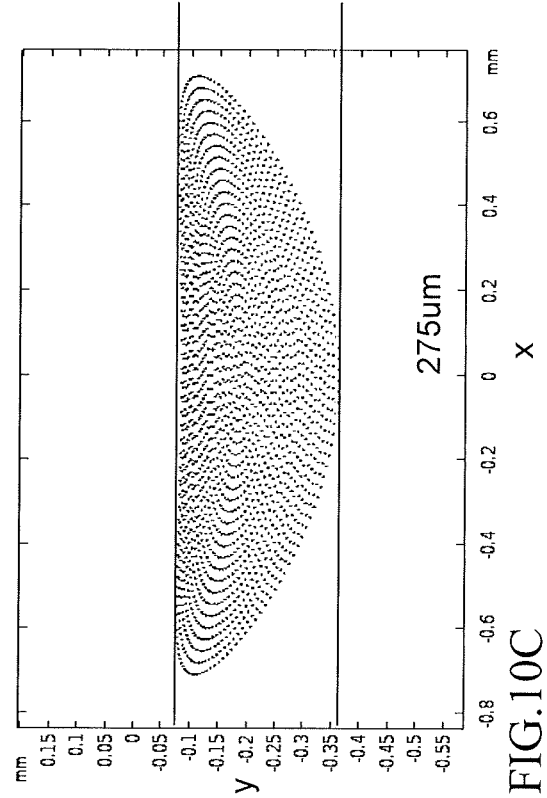

FIG. 6 illustrates an electric potential to be applied to each electrode substrate of the second stage deflector according to the first embodiment. In FIG. 6, a potential $V_{21}$ is applied to the electrode substrate 251 of the second stage deflector 232. A potential $V_{22}$ is applied to the electrode substrate 252. A potential $V_{23}$ is applied to the electrode substrate 253. A potential $V_{24}$ is applied to the electrode substrate 254. A potential $V_{25}$ is applied to the electrode substrate 255. A potential $V_{26}$ is applied to the electrode substrate 256. A potential $V_{27}$ is applied to the electrode substrate 257. A potential $V_{28}$ is applied to the electrode substrate 258. In the case where the designed trajectory center of the multiple secondary electron beams 300 passing through the inside of the second stage deflector 232 is in $z_2$ direction, the side of the electrode substrates 252, 253, and 254 is $+y_2$ direction in controlling deflection. Moreover, the side of the electrode substrates 256, 257, and 258 is $-y_2$ direction in controlling deflection. Further, the side of the electrode substrate 251 is $+x_2$ direction in controlling deflection. Furthermore, the side of the electrode substrate 255 is $-x_2$ direction in controlling deflection.

In the first embodiment, one compact bending deflector 218 performs the following: an alignment deflection for correcting a relative positional deviation between such as the bending deflector 218 and multi-detector 222 which occurs because of mechanical tolerance in manufacturing, a scan cancelling deflection for cancelling a deviation of the electron receiving position of the multiple secondary electron beams 300 on the electron receiving surface of the multi-detector 222, which occurs along with the movement of the deflection position of the multiple primary electron beams 20 occurring along with tracking deflection and scanning operation, an astigmatism correction, and a focus correction. These alignment deflection for correcting a relative positional deviation between such as the bending deflector 218 and multi-detector 222 which occurs because of mechanical tolerance in manufacturing, the scan cancelling deflection for cancelling a deviation of the light receiving position of the multiple secondary electron beams 300 on the light receiving surface of the multi-detector 222, which occurs along with the movement of the deflection position of the multiple primary electron beams 20 occurring along with tracking deflection and scanning operation, and the astigmatism correction can also be performed by the first stage deflector 230 alone. Similarly, they can also be performed by the second stage deflector 232 alone. When they are performed by the two stage deflection of the first and second stage deflectors 230 and 232, the deflection amount per stage can be reduced compared to being performed by one deflector alone. Consequently, new aberration etc. generated in the multiple secondary electron beams 300 along with the deflection can also be suppressed.

With respect to the focus correction, it can be executed by the same lens action as that of the electrostatic lens, specifically by variably controlling the potential V3 of the aperture electrode substrate 235 of the intermediate electrode 234 in the state where a predetermined reference bias potential $f_1$ has been applied to the first stage deflector 230 and a predetermined reference bias potential $f_2(=f_1)$ has been applied to the second stage deflector 232. Now, the potential to be applied to each electrode substrate for providing the alignment deflection, the scan cancelling deflection, the astigmatism correction, and the focus correction will be described below.

FIG. 7 shows a weight coefficient list of weight coefficients of potentials to be applied to the electrode substrates of the first stage deflector according to the first embodiment. In FIG. 7, the ordinate axis represents, as items in order from the upper side, an alignment deflection in $x_1$ direction, an alignment deflection in $y_1$ direction, a scan cancelling deflection in $x_1$ direction, a scan cancelling deflection in $y_1$ direction, an astigmatism correction to the detector light receiving surface, and a focus correction on the detector light receiving surface. The abscissa axis represents electrode substrate numbers. Thus, at the position specified by the item of the ordinate axis and the number of the abscissa axis, the weight coefficient of a potential to be applied to the electrode substrate of the number concerned at the item concerned.

In FIG. 7, when an alignment deflection is applied to the multiple secondary electron beams 300 toward the electrode substrate 241 (first electrode substrate) side ($+x_1$ direction), deflection potentials obtained by the weight coefficients 1, $1/\sqrt{2}$, 0, $-1/\sqrt{2}$, $-1$, $-1/\sqrt{2}$, 0, and $1/\sqrt{2}$ are applied, in order, to the electrode substrates from 241 to 248. When the multiple secondary electron beams 300 are deflected from the incident position at the first stage deflector 230 by, for example, the deflection amount L1 in the $+x_1$ direction to be emitted from the first stage deflector 230, $V_1=A_{1x}$, $V_{12}=A_{1x}/\sqrt{2}$, $V_{13}=0$, $V_{14}=-A_{1x}/\sqrt{2}$, $V_{15}=-A_{1x}$, $V_{16}=-A_{1x}/\sqrt{2}$, $V_{17}=0$, and $V_{18}=A_{1x}/\sqrt{2}$ are applied using the reference potential $A_{1x}$ corresponding to the deflection amount L1.

In FIG. 7, when an alignment deflection is applied to the multiple secondary electron beams 300 toward the electrode substrate 243 (third electrode substrate) side (+y$_1$ direction) deflection potentials obtained by the weight coefficients 0, 1/√2, 1, 1/√2, 0, −1/√2, −1, and −1/√2 are applied, in order, to the electrode substrates from 241 to 248. When the multiple secondary electron beams 300 are deflected from the incident position at the first stage deflector 230 by, for example, the deflection amount L1' in the +y$_1$ direction to be emitted from the first stage deflector 230, $V_{11}=0$, $V_{12}=A_{1y}/\sqrt{2}$, $V_{13}=A_{1y}$, $V_{14}=A_{1y}/\sqrt{2}$, $V_{15}=0$, $V_{16}=-A_{1y}/\sqrt{2}$, $V_{17}=-A_{1y}$, and $V_{18}=-A_{1y}/\sqrt{2}$ are applied using the reference potential $A_{1y}$ corresponding to the deflection amount L1'.

In FIG. 7, when a scan cancelling deflection is applied to the multiple secondary electron beams 300 toward the electrode substrate 241 (first electrode substrate) side (+x$_1$ direction), deflection potentials obtained by the weight coefficients 1, 1/√2, 0, −1/√2, −1, −1/√2, 0, and 1/√2 are applied, in order, to the electrode substrates from 241 to 248. When the multiple secondary electron beams 300 are deflected from the incident position at the first stage deflector 230 by, for example, the deflection amount L2 in the +x$_1$ direction to be emitted from the first stage deflector 230, $V_{11}=D_{1x}$, $V_{12}=D_{1x}/\sqrt{2}$, $V_{13}=0$, $V_{14}=-D_{1x}/\sqrt{2}$, $V_{15}=-D_{1x}$, $V_{16}=-D_{1x}/\sqrt{2}$, $V_{17}=0$, and $V_{18}=D_{1x}/\sqrt{2}$ are applied using the reference potential $D_{1x}$ corresponding to the deflection amount L2.

In FIG. 7, when a scan cancelling deflection is applied to the multiple secondary electron beams 300 toward the electrode substrate 243 (third electrode substrate) side (+y$_1$ direction) deflection potentials obtained by the weight coefficients 0, 1/√2, 1, 1/√2, 0, −1/√2, −1, and −1/√2 are applied, in order, to the electrode substrates from 241 to 248. When the multiple secondary electron beams 300 are deflected from the incident position at the first stage deflector 230 by, for example, the deflection amount L2' in the +y$_1$ direction to be emitted from the first stage deflector 230, $V_{11}=D_{1y}$, $V_{12}=D_{1y}/\sqrt{2}$, $V_{14}=D_{1y}/\sqrt{2}$, $V_{15}=0$, $V_{16}=-D_{1y}/\sqrt{2}$, $V_{17}=-D_{1y}$, and $V_{18}=-D_{1y}/\sqrt{2}$ are applied using the reference potential $D_{1y}$ corresponding to the deflection amount L2'.

In FIG. 7, when changing the beam shape of the multiple secondary electron beams 300 (when correcting astigmatism), deflection potentials obtained by $S_1\cdot\cos(2\cdot\theta 1)$, $S_1\cdot\sin(2\cdot\theta 1)$, $-S_1\cdot\cos(2\cdot\theta 1)$, $-S_1\cdot\sin(2\cdot\theta 1)$, $S_1\cdot\cos(2\cdot\theta 1)$, $S_1\cdot\sin(2\cdot\theta 1)$, $-S_1\cdot\cos(2\cdot\theta 1)$, and $-S_1\cdot\sin(2\cdot\theta 1)$ are applied, in order, to the electrode substrates from 241 to 248, using the correction amount $S_1$ and the correction angle θ1. In order words, $V_{11}=S_1\cdot\cos(2\cdot\theta 1)$ $V_{12}=S_1\cdot\sin(2\cdot\theta 1)$, $V_{13}=-S_1\cdot\sin(2\cdot\theta 1)$, $V_{14}=-S_1\cdot\sin(2\cdot\theta 1)$, $V_{15}=S_1\cdot\cos(2\cdot\theta 1)$, $V_{16}=S_1\cdot\sin(2\cdot\theta 1)$, $V_{17}=-S_1\cdot\cos(2\cdot\theta 1)$, and $V_{18}=-S_1\cdot\sin(2\cdot\theta 1)$ are applied.

In FIG. 7, when changing the focus position of the multiple secondary electron beams 300, potentials obtained by weight coefficients 1, 1, 1, 1, 1, 1, 1, and 1 are applied, in order, to the electrode substrates from 241 to 248. In other words, $V_{11}=f\#$, $V_{12}=f\#$, $V_{13}=f\#$, $V_{14}=f\#$, $V_{15}=f\#$, $V_{16}=f\#$, $V_{17}=f\#$, and $V_{18}=f\#$ are applied using the reference bias potential $f\#$. The above-described voltages are examples, and preferably, the voltage is adjusted for optimization. Moreover, it is preferable that adjustment is performed while adding a correction value for correcting a mechanical error due to manufacturing of the device.

A corresponding total potential is applied to each of the electrode substrates from 241 to 248. Each corresponding total potential for each of the electrode substrates from 241 to 248 is individually obtained by adding a deflection potential used when performing deflection for alignment (positioning) toward the electrode substrate 241 side (+x$_1$ direction), a deflection potential used when performing deflection for alignment toward the electrode substrate 243 side (+y$_1$ direction), a deflection potential used when performing deflection toward the electrode substrate 241 side (+x$_1$ direction) in order to eliminate positional deviation occurring along with a scanning operation, a deflection potential used when deflecting the multiple secondary electron beams 300 toward the electrode substrate 243 side (+y$_1$ direction) in order to eliminate positional deviation occurring along with a scanning operation, a deflection potential used when changing the beam shape in order to correct astigmatism, and a potential used when changing the focus position of the multiple secondary electron beams 300. For example, $V_{12}=(A_{1x}+A_{1y}+D_{1x}+D_{1y})/\sqrt{2}+S_1\cdot\sin(2\cdot\theta 1)+f\#$ is applied to the electrode substrate 242.

FIG. 8 shows a weight coefficient list of weight coefficients of potentials to be applied to the electrode substrates of the second stage deflector according to the first embodiment. In FIG. 8, the ordinate axis represents, as items in order from the upper side, an alignment deflection in x$_2$ direction, an alignment deflection in y$^2$ direction, a scan cancelling deflection in x$^2$ direction, a scan cancelling deflection in y$_2$ direction, an astigmatism correction in the x$_2$ and y$_2$ directions, and a focus correction on the detector light receiving surface. The abscissa axis represents electrode substrate numbers. Thus, at the position specified by the item of the ordinate axis and the number of the abscissa axis, the weight coefficient of a potential to be applied to the electrode substrate of the number concerned at the item concerned.

In FIG. 8, when an alignment deflection is applied to the multiple secondary electron beams 300 toward the electrode substrate 251 (first electrode substrate) side (+x$_2$ direction), deflection potentials obtained by the weight coefficients 1, 1/√2, 0, −1/√2, −1, −1/√2, 0, and 1/√2 are applied, in order, to the electrode substrates from 251 to 258. When the multiple secondary electron beams 300 are deflected from the incident position at the second stage deflector 232 by, for example, the deflection amount L1 in the +x$_2$ direction to be emitted from the second stage deflector 232, $V_{21}=A_{2x}$, $V_{22}=A_{2x}$, $V_{23}=0$, $V_{24}=-A_{2x}/\sqrt{2}$, $V_{25}=-A_{2x}$, $V_{26}=-A_{2x}/\sqrt{2}$, $V_{27}=0$, and $V_{28}=A_{2x}/\sqrt{2}$ are applied using the reference potential $A_{2x}$ corresponding to the deflection amount L1.

In FIG. 8, when an alignment deflection is applied to the multiple secondary electron beams 300 toward the electrode substrate 253 (third electrode substrate) side (+y$_2$ direction) deflection potentials obtained by the weight coefficients 0, 1/·2, 1, 1/√2, 0, −1/√2, −1, and −1/√2 are applied, in order, to the electrode substrates from 251 to 258. When the multiple secondary electron beams 300 are deflected from the incident position at the second stage deflector 232 by, for example, the deflection amount L1' in the +y$_2$ direction to be emitted from the second stage deflector 232, $V_{21}=0$, $V_{22}=A_{2y}/\sqrt{2}$, $V_{23}=A_{2y}$, $V_{24}=A_{2y}/\sqrt{2}$, $V_{25}=0$, $V_{26}=-A_{2y}/\sqrt{2}$, $V_{27}=-A_{2y}$, and $V_{28}=-A_{2y}/\sqrt{2}$ are applied using the reference potential $A_{2y}$ corresponding to the deflection amount L1'.

In FIG. 8, when a scan cancelling deflection is applied to the multiple secondary electron beams 300 toward the electrode substrate 251 (first electrode substrate) side (+x$_2$ direction), deflection potentials obtained by the weight coefficients 1, 1/√2, 0, −1/·2, −1, −1/√2, 0, and 1/·2 are applied, in order, to the electrode substrates from 251 to 258. When the multiple secondary electron beams 300 are deflected from the incident position at the second stage deflector 232 by, for example, the deflection amount L2 in the +x$_2$ direction to be emitted from the second stage deflector 232, $V_{21}=D_{2x}$, $V_{22}=D_{2x}/\cdot 2$, $V_{23}=0$, $V_{24}=-D_{2x}/\sqrt{2}$, $V_{25}=-D_{2x}$, $V_{26}=-D_{2x}/\sqrt{2}$, $V_{27}=0$, and $V_{28}=D_{2x}/\sqrt{2}$ are applied using the reference potential $D_{2x}$ corresponding to the deflection amount L2.

In FIG. 8, when a scan cancelling deflection is applied to the multiple secondary electron beams 300 toward the electrode substrate 253 (third electrode substrate) side (+y$_2$ direction) deflection potentials obtained by the weight coefficients 0, 1/√2, 1, 1/√2, 0, −1/·2, −1, and −1/√2 are applied, in order, to the electrode substrates from 251 to 258. When the multiple secondary electron beams 300 are deflected from the incident position at the second stage deflector 232 by, for example, the deflection amount L2' in the +y$_2$ direction to be emitted from the second stage deflector 232, $V_{21}=0$, $V_{22}=D_{2y}/\sqrt{2}$, $V_{23}=D_{2y}$, $V_{24}=D_{2y}/\sqrt{2}$, $V_{25}=0$, $V_{26}=-D_{2y}/\sqrt{2}$, $V_{27}=-D_{2y}$, and $V_{28}=-D_{2y}/\sqrt{2}$ are applied using the reference potential $D_{2y}$ corresponding to the deflection amount L2'.

In FIG. 8, when changing the beam shape of the multiple secondary electron beams 300 (when correcting astigmatism), deflection potentials obtained by $S_2 \cdot \cos(2 \cdot \theta 2)$, $S_2 \cdot \sin(2 \cdot \theta 2)$, $-S_2 \cdot \cos(2 \cdot \theta 2)$, $-S_2 \cdot \sin(2 \cdot \theta 2)$, $S_2 \cdot \cos(2 \cdot \theta 2)$, $S_2 \cdot \sin(2 \cdot \theta 2)$, $-S_2 \cdot \cos(2 \cdot \theta 2)$, and $-S_2 \cdot \sin(2 \cdot \theta 2)$ are applied, in order, to the electrode substrates from 251 to 258, using the correction amount $S_2$ and the correction angle $\theta 2$. In order words, $V_{21}=S_2 \cdot \cos(2 \cdot \theta 2)$, $V_{22}=S_2 \cdot \sin(2 \cdot \theta 2)$, $V_{23}=-S_2 \cdot \sin(2 \cdot \theta 2)$, $V_{24}=-S_2 \cdot \sin(2 \cdot \theta 2)$, $V_{25}=S_2 \cdot \cos(2 \cdot \theta 2)$, $V_{26}=S_2 \cdot \sin(2 \cdot \theta 2)$, $V_{27}=-S_2 \cdot \cos(2 \cdot \theta 2)$, and $V_{28}=-S_2 \cdot \sin(2 \cdot \theta 2)$ are applied.

In FIG. 8, when changing the focus position of the multiple secondary electron beams 300, potentials obtained by the weight coefficients 1, 1, 1, 1, 1, 1, 1, and 1 are applied, in order, to the electrode substrates from 251 to 258. In other words, $V_{21}=f_2$, $V_{22}=f_2$, $V_{23}=f_2$, $V_{24}=f_2$, $V_{25}=f_2$, $V_{26}=f_2$, $V_{27}=f_2$, and $V_{28}=f_2$ are applied using the reference bias potential $f_2$. The above-described voltages are examples, and preferably, the voltage is adjusted for optimization. Moreover, it is preferable that adjustment is performed while adding a correction value for correcting a mechanical error due to manufacturing of the device.

Therefore, a potential is applied to each of the electrode substrates from 251 to 258, which is obtained by adding a deflection potential used when performing deflection for alignment toward the electrode substrate 251 side (+x$_2$ direction). a deflection potential used when performing deflection for alignment toward the electrode substrate 253 side (+y$_2$ direction), a deflection potential used when performing deflection toward the electrode substrate 251 side (+x$_2$ direction) in order to eliminate positional deviation occurring along with a scanning operation, a deflection potential used when deflecting the multiple secondary electron beams 300 toward the electrode substrate 253 side (+y$_2$ direction) in order to eliminate positional deviation occurring along with a scanning operation, a deflection potential used when changing the beam shape in order to correct astigmatism, and a potential used when changing the focus position of the multiple secondary electron beams 300. For example, $V_{22}=(A_{2x}+A_{2y}+D_{2x}+D_{2y})/\cdot 2+S2 \cdot \sin(2 \cdot \theta 2)+f_2$ is applied to the electrode substrate 242. The above-described voltages are examples, and preferably, the voltage is adjusted for optimization. Moreover, it is preferable that adjustment is performed while adding a correction value for correcting a mechanical error due to manufacturing of the device. If there is a beam rotation between the first stage deflector 230 and the second stage deflector 232, assuming that the rotation is θ, $A_{2X}$, $A_{2Y}$, $D_{2X}$, and $D_{2Y}$ are corrected by the following equation:

$$\begin{pmatrix} x' \\ y' \end{pmatrix} = \begin{pmatrix} \cos\theta & -\sin\theta \\ \sin\theta & \cos\theta \end{pmatrix} \begin{pmatrix} x \\ y \end{pmatrix}$$

FIGS. 9A to 9E show examples of a multiple secondary electron beam image after beam deflection by a bending deflector according to the first embodiment. FIGS. 9A to 9E show images detected by the multi-detector 222 in the case of the trajectory center of the multiple secondary electron beams 300 being moved from the −y side to the +y side in order by the bending deflector 218. Thus, as shown in FIGS. 9A to 9E, the trajectory of the multiple secondary electron beams 300 can be adjusted in the y direction by the bending deflector 218. In other words, it turns out that alignment deflection and scan cancelling deflection can be performed. Although here shifting is executed in the y direction, it is also possible to perform shifting in the x direction.

FIGS. 10A to 10D show examples of a multiple secondary electron beam image after beam shape correction by a bending deflector according to the first embodiment. FIGS. 10A to 10D show the case of the focus position having been changed by the bending deflector 218.

FIGS. 11A to 11I show other examples of a multiple secondary electron beam image after beam shape correction by the bending deflector according to the first embodiment.

FIGS. 12A to 12F show other examples of a multiple secondary electron beam image after beam shape correction by the bending deflector according to the first embodiment. FIGS. 11A to 11I and FIGS. 12A to 12F show images detected by the multi-detector 222 in the case of changing the image of the multiple secondary electron beams 300 under conditions further changed by the bending deflector 218. It turns out, as shown in FIGS. 11A to 11I and FIGS. 12A to 12F, that the shape of the multiple secondary electron beams 300 can be further changed by the bending deflector 218 to a long flat shape having a narrower width in the x direction and a longer length in the y direction.

As described above, the size of the bending deflector 218 according to the first embodiment can be reduced compared to the conventional deflector. Further, since the bending deflector 218 can simultaneously accomplish the alignment deflection, scan cancelling deflection, astigmatism correction, and focus correction to the multiple secondary electron beams 300, the number of configurations of the optical equipment necessary for guiding the multiple secondary electron beams 300 to the multi-detector 222 can be reduced compared to the conventional one.

Using the multiple secondary electron beams 300 to which alignment deflection, scan cancelling deflection, astigmatism correction, and focus correction are simultaneously applied by the bending deflector 218 with the structure described above, pattern inspection is performed to the inspection substrate.

Figure 13:
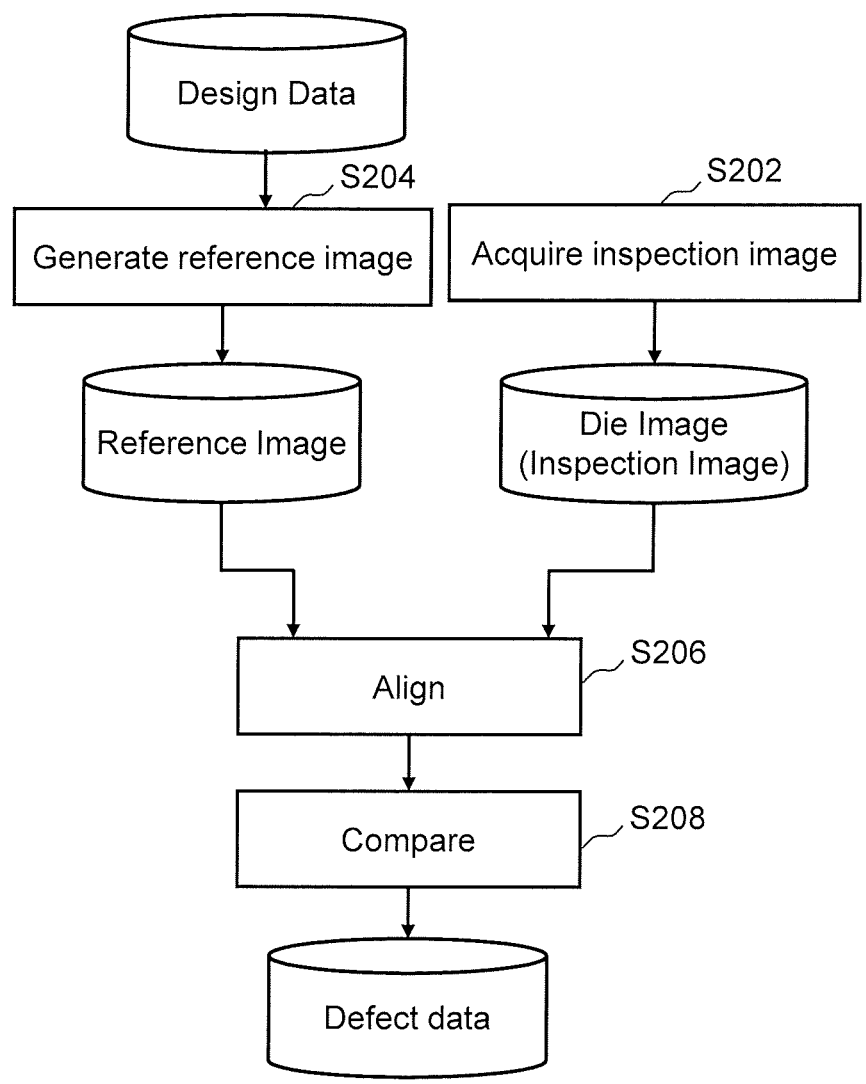
FIG. 13 is a flowchart showing main steps of an inspection method according to the first embodiment.

FIG. 13 is a flowchart showing main steps of an inspection method according to the first embodiment. In FIG. 13, the inspection method of the first embodiment executes a series of steps: an inspection image acquiring step (S202), a reference image generation step (S204), an alignment step (S206), and a comparison step (S208).

In the inspection image acquiring step (S202), the image acquisition mechanism 150 acquires a secondary electron image of the pattern formed on the substrate 101, by using the multiple primary electron beams 20. Specifically, it operates as follows:

As described above, the multiple primary electron beams 20 having passed through the limiting aperture substrate 206 pass through the beam separator 214, and are focused on the substrate 101 (target object) by the objective lens 207 in order to irradiate respective beam irradiation positions on the substrate 101 by the main deflector 208 and the sub deflector 209.

The multiple secondary electron beams 300 including reflected electrons, corresponding to the multiple primary electron beams 20, are emitted from the substrate 101 due to that desired positions on the substrate 101 are irradiated with the multiple primary electron beams 20. The multiple secondary electron beams 300 emitted from the substrate 101 pass through the objective lens 207 and travel to the beam separator 214 so as to be bent diagonally upward. To the multiple secondary electron beams 300 having been bent diagonally upward, an alignment deflection, a scan cancelling deflection, an astigmatism correction, and a focus correction are simultaneously applied by the bending deflector 218. Then, the multiple secondary electron beams 300 are projected on the multi-detector 222 while being refracted by the projection lens 224. Thus, the multi-detector 222 detects the multiple secondary electron beams 300, including reflected electrons, emitted due to that the substrate 101 surface is irradiated with the multiple primary electron beams 20.

Figure 14:
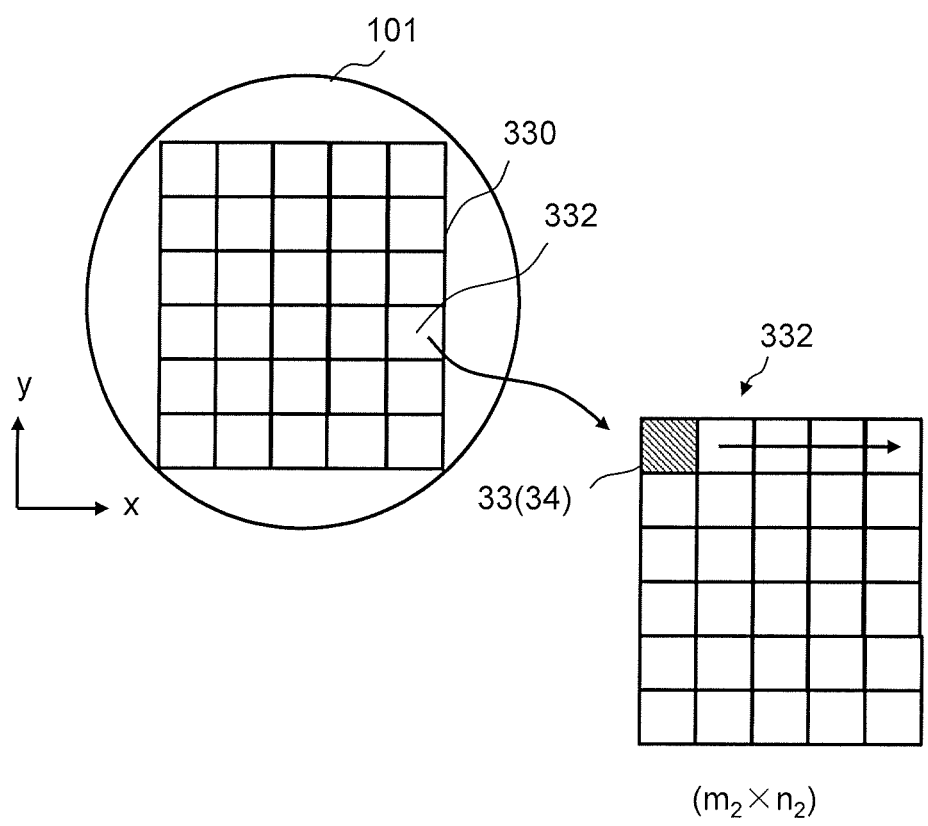
FIG. 14 shows an example of a plurality of chip regions formed on a semiconductor substrate, according to the first embodiment.

FIG. 14 shows an example of a plurality of chip regions formed on a semiconductor substrate, according to the first embodiment. In FIG. 14, when the substrate 101 is a semiconductor substrate (wafer), a plurality of chips (wafer die) 332 in a two-dimensional array are formed in an inspection region 330 of the semiconductor substrate 101. A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of m, columns wide (width in the x direction) and n, rows long (length in the y direction) (each of $m_2$ and $n_2$ is an integer of 2 or greater), for example. In the first embodiment, the mask die 33 serves as a unit inspection region.

Figure 15:
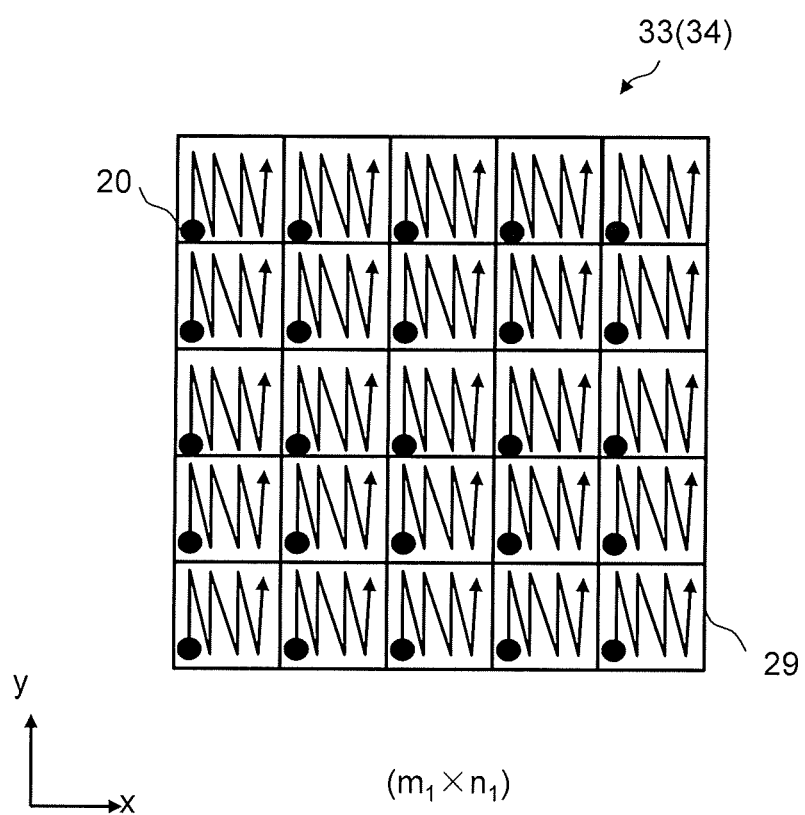
FIG. 15 illustrates a scanning operation using multiple beams according to the first embodiment.

FIG. 15 illustrates a scanning operation using multiple beams according to the first embodiment. FIG. 15 shows the case of multiple primary electron beams of 5×5 (rows by columns). The size of the irradiation region 34 that can be irradiated with one irradiation of the multiple primary electron beams 20 is defined by (x direction size obtained by multiplying pitch between beams in x direction of the multiple primary electron beams 20 on the substrate 101 by the number of beams in the x direction)×(y direction size obtained by multiplying pitch between beams in y direction of the multiple primary electron beams 20 on the substrate 101 by the number of beams in the y direction). In the case of FIG. 15, the irradiation region 34 and the mask die 33 are of the same size. However, it is not limited thereto. The irradiation region 34 may be smaller than the mask die 33, or larger than it. Each beam of the multiple primary electron beams 20 scans the inside of a sub-irradiation region 29 surrounded by the pitch between beams in the x direction and the pitch between beams in the y direction where the beam concerned itself is located. Each beam of the multiple primary electron beams 20 is associated with any one of the sub-irradiation regions 29 which are different from each other. At the time of each shot, each beam irradiates the same position in the associated sub-irradiation region 29. Movement of the beam in the sub-irradiation region 29 is executed by collective deflection of the whole multiple primary electron beams 20 by the sub deflector 209. By repeating this operation, one beam irradiates all the pixels in order in one sub-irradiation region 29.

As described above, the whole multiple primary electron beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple primary electron beams 20, secondary electrons are emitted from the irradiated positions at each shot time to be detected by the multi-detector 222.

By performing scanning using the multiple primary electron beams 20 as described above, the scanning operation (measurement) can be performed at a higher speed than scanning by a single beam. The scanning of each mask die 33 may be performed by the "step and repeat" operation, alternatively it may be performed by continuously moving the XY stage 105. When the irradiation region 34 is smaller than the mask die 33, the scanning operation may be performed while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). However, since a pattern for one chip is formed on the exposure mask substrate, the number of times of scanning can be less compared to the case of the semiconductor substrate on which more than four chips are formed.

As described above, using the multiple primary electron beams 20, the image acquisition mechanism 150 scans the substrate 101 to be inspected, on which a figure pattern is formed, and detects the multiple secondary electron beams 300 emitted from the inspection substrate 101 due to irradiation of the multiple primary electron beams 20 onto the inspection substrate 101. Detected data on a secondary electron (measured image: secondary electron image: image to be inspected) from each position detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, with information data on each position from the position circuit 107.

In the reference image generating step (S204), the reference image generation circuit 112 (reference image generation unit) generates a reference image corresponding to an inspection image to be inspected. Based on design data serving as a basis for forming a pattern on the substrate 101, or design pattern data defined in exposure image data of a pattern formed on the substrate 101, the reference image generation circuit 112 generates a reference image for each frame region. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $1/2^8 (=1/256)$, the occupancy rate in each pixel is calculated by allocating small regions which correspond to the region of figures arranged in the pixel concerned and each of which is corresponding to a $1/256$ resolution. Then, 8-bit occupancy rate data is output to the reference circuit 112. The mesh region (inspection pixel) may be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values. The generated image data of a reference image is output to the comparison circuit 108.

Figure 16:
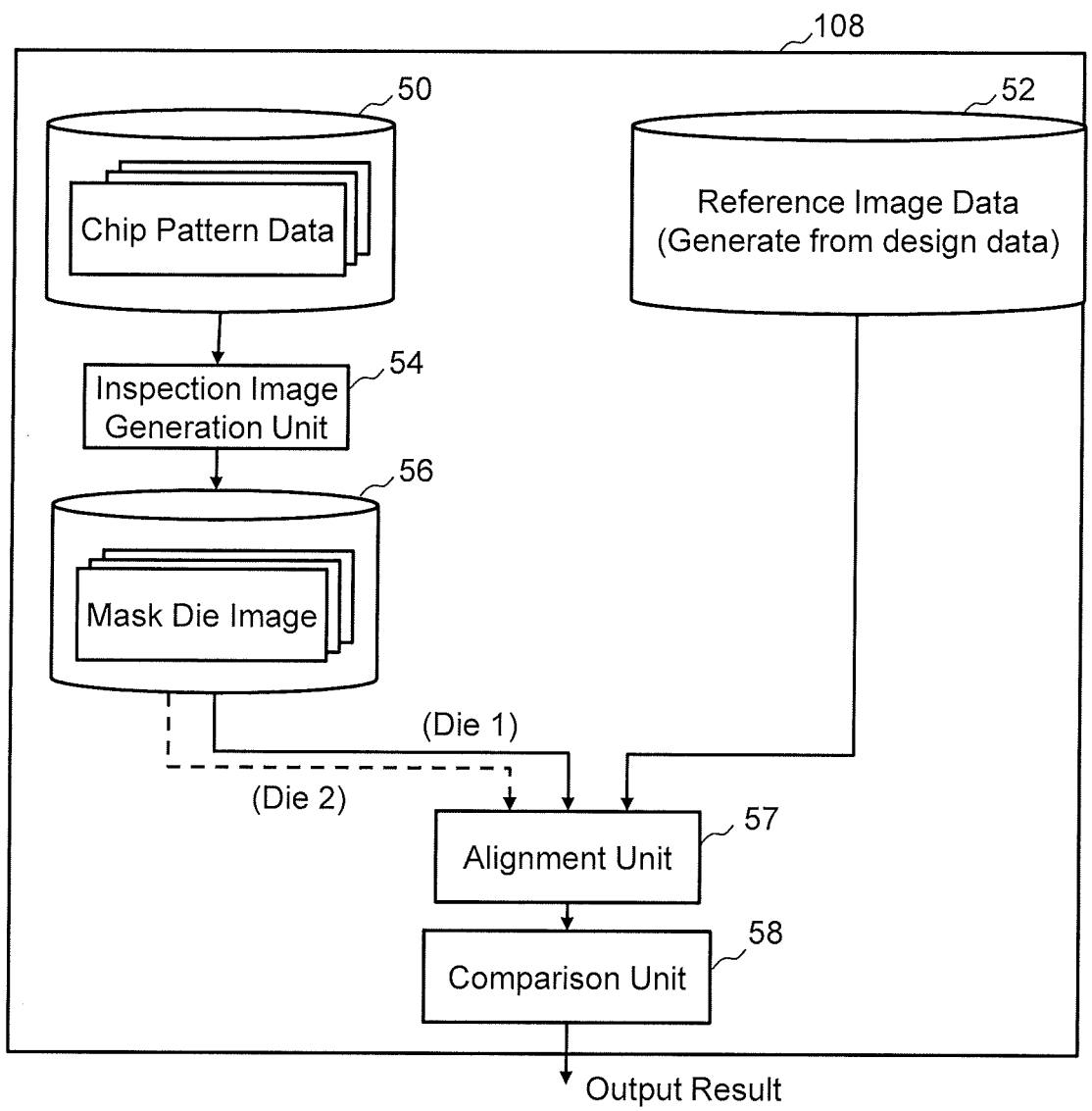
FIG. 16 shows an internal configuration of a comparison circuit according to the first embodiment.

FIG. 16 shows an internal configuration of a comparison circuit according to the first embodiment. In FIG. 16, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the inspection image generation unit 54, the alignment unit 57, and the comparison unit 58, and calculated results are stored in a memory (not shown) or in the memory 118 each time.

In the comparison circuit 108, the transmitted stripe pattern data (or chip pattern data) is temporarily stored in the storage device 50, with information indicating each position from the position circuit 107. Moreover, transmitted reference image data is temporarily stored in the storage device 52.

Next, the inspection image generation unit 54 generates a frame image (inspection image, that is, image to be inspected) by using stripe pattern data (or chip pattern data), for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads the mask die image being an inspection image, and the reference image corresponding to the mask die image, and provides alignment between the images based on a sub-pixel unit smaller than the pixel 36. For example, the alignment (positioning) may be performed by a least-square method.

In the comparing step (S208), the comparison unit 58 compares the mask die image (inspection image) and the reference image concerned. The comparison unit 58 compares, for each pixel 36, both the images, based on predetermined determination conditions in order to determine whether there is a defect such as a shape defect. For example, if a gray scale value difference for each pixel 36 is larger than a determination threshold Th, it is determined that there is a defect. Then, the comparison result is output, and specifically, output to the storage device 109, monitor 117, or memory 118, or alternatively, output from the printer 119.

Although the die-to-database inspection is described above, the die-to-die inspection may also be performed. In the case of conducting the die-to-die inspection, images of identical patterns on the same mask die 33 are compared. Accordingly, a mask die image of a partial region of the wafer die 332 serving as the die (1), and a mask die image of a corresponding region of another wafer die 332 serving as the die (2) are used. Alternatively, a mask die image of a partial region of the wafer die 332 serving as the die (1) and a mask die image of another partial region of the same wafer die 332 serving as the die (2), where identical patterns are formed, may be compared. In such a case, as long as one of the images of the mask die 33 on which identical patterns are formed is used as a reference image, inspection can be accomplished by the same method as that of the die-to-database inspection described above.

That is, in the alignment step (S206), the alignment unit 57 reads the mask die image of the die (1) and the mask die image of the die (2), and provides alignment between the images based on a sub-pixel unit smaller than the pixel 36. For example, the alignment may be performed by a least-square method.

Then, in the comparing step (S208), the comparison unit 58 compares the mask die image of the die (1) and the mask die image of the die (2). The comparison unit 58 compares, for each pixel 36, both the images, based on predetermined determination conditions in order to determine whether there is a defect such as a shape defect. For example, if a gray scale value difference for each pixel 36 is larger than a determination threshold Th, it is determined that there is a defect. Then, the comparison result is output, and specifically, output to the storage device 109, monitor 117, or memory 118, or alternatively, output from the printer 119.

As described above, according to the first embodiment, the bending deflector 218 of compact size can simultaneously complete additional operations for multiple secondary electron beams, such as guiding the multiple secondary electron beams to the detector after the multiple primary electron beams and the multiple secondary electron beams have been separated from each other, cancelling out (compensating for) positional deviation due to scanning deflection, adjusting a focal point, correcting astigmatism, and the like.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the reference image generation circuit 112, the deflector control circuit 121, the deflection control circuit 128, etc. may be configured by at least one processing circuitry described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other deflector for multiple electron beams and multiple beam image acquiring apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A deflector for multiple electron beams comprising:
a first electrode substrate;
second to fourth electrode substrates disposed in order in parallel to each other in a first same plane which is orthogonal to a substrate surface of the first electrode substrate;
a fifth electrode substrate; and
sixth to eighth electrode substrates disposed in order in parallel to each other in a second same plane such that they are opposite to the second to fourth electrode substrates,
wherein the first, second, third, fourth, fifth, sixth, seventh, and eighth electrode substrates are disposed such that they define a space through which multiple electron beams pass, such that the fifth electrode substrate faces the first electrode substrate across the space.

2. The deflector according to claim 1, wherein
the deflector is configured to deflect the multiple electron beams toward the first electrode substrate, by applying, in order, deflection potentials obtained by weight coefficients 1, $1/\sqrt{2}$, 0, $-1/\sqrt{2}$, $-1$, $-1/\sqrt{2}$, 0, and $1/\sqrt{2}$ to the first to eighth electrode substrates, and
the deflector is configured to deflect the multiple electron beams toward the third electrode substrate, by applying, in order, deflection potentials obtained by weight coefficients 0, $1/\sqrt{2}$, 1, $1/\sqrt{2}$, 0, $-1/\sqrt{2}$, $-1$, and $-1/\sqrt{2}$ to the first to eighth electrode substrates.

3. The deflector according to claim 1, wherein,
the deflector is configured to change a beam shape of the multiple electron beams, by applying, in order, deflection potentials obtained by $S \cdot \cos(2\theta)$, $S \cdot \sin(2\theta)$, $-S \cdot \cos(2\theta)$, $-S \cdot \sin(2\theta)$, $S \cdot \cos(2\theta)$, $S \cdot \sin(2\theta)$, $-S \cdot \cos(2\theta)$, and $-S \cdot \sin(2\theta)$ to the first to eighth electrode substrates, using a correction amount S and a correction angle $\theta$.

4. The deflector according to claim 1, wherein,
the deflector is configured to change a focus position of the multiple electron beams, by applying potentials obtained by all same weight coefficients to the first to eighth electrode substrates.

5. The deflector according to claim 1, wherein
the deflector is configured to apply a deflection for alignment to the multiple electron beams to deflect toward the first electrode substrate, by applying, in order, deflection potentials obtained by weight coefficients 1, 0, $-1/\sqrt{2}$, $-1$, $-1/\sqrt{2}$, 0, and $1/\sqrt{2}$ to the first to eighth electrode substrates,
the deflector is configured to apply a deflection for alignment to the multiple electron beams to deflect toward the third electrode substrate, by applying, in order deflection potentials obtained by weight coefficients 0, $1/\sqrt{2}$, 1, $1/\sqrt{2}$, 0, $-1/\sqrt{2}$, $-1$, and $-1/\sqrt{2}$ to the first to eighth electrode substrates,
the deflector is configured to deflect the multiple electron beams toward the first electrode substrate to eliminate positional deviation occurring along with a scanning operation, by applying, in order, deflection potentials obtained by weight coefficients 1, $1/\sqrt{2}$, 0, $-1/\sqrt{2}$, $-1$, $-1/\sqrt{2}$, 0, and $1/\sqrt{2}$ to the first to eighth electrode substrates,
the deflector is configured to deflect the multiple electron beams toward the third electrode substrate to eliminate positional deviation occurring along with a scanning operation, by applying, in order, deflection potentials obtained by weight coefficients 0, $1/\sqrt{2}$, 1, $1/\sqrt{2}$, 0, $-1/\sqrt{2}$, $-1$, and $-1/\sqrt{2}$ to the first to eighth electrode substrates,
the deflector is configured to change a beam shape of the multiple electron beams, by applying, in order, deflection potentials obtained by $S \cdot \cos(2\theta)$, $S \cdot \sin(2\theta)$, $-S \cdot \cos(2\theta)$, $-S \cdot \sin(2\theta)$, $S \cdot \cos(2\theta)$, $S \cdot \sin(2\theta)$, $-S \cdot \cos(2\theta)$, and $-S \cdot \sin(2\theta)$ to the first to eighth electrode substrates, using a correction amount S and a correction angle $\theta$, and
the deflector is configured to change a focus position of the multiple electron beams, by applying potentials obtained by all same weight coefficients to the first to eighth electrode substrates,
wherein a corresponding total potential is applied to each of the first to eighth electrode substrates, each corresponding total potential for the each of the first to eighth electrode substrates being individually obtained by adding a deflection potential used for applying the deflection for alignment toward the first electrode substrate, a deflection potential used for applying the deflection for alignment toward the third electrode substrate, a deflection potential used for deflecting toward the first electrode substrate in order to eliminate positional deviation occurring along with the scanning operation, a deflection potential used for deflecting the multiple electron beams toward the third electrode substrate in order to eliminate positional deviation occurring along with the scanning operation, a deflection potential used for changing the beam shape, and a potential used for changing the focus position of the multiple electron beams.

6. The deflector according to claim 1, wherein a first deflector is composed of the first to eighth electrode substrates, the deflector further comprising:
a second deflector composed of first to eighth electrode substrates which are similar to the first to eighth electrode substrates of the first deflector,
wherein the first deflector is connected to the second deflector at an angle in a direction different from a direction in which the first deflector bends a beam trajectory of the multiple electron beams, and the second deflector is connected to the first deflector at an angle in a direction different from a direction in which the second deflector bends the beam trajectory of the multiple electron beams.

7. The deflector according to claim 6, further comprising:
an aperture electrode substrate, disposed between the first deflector and the second deflector, the aperture electrode substrate forming an aperture through which the multiple electron beams pass.

8. The deflector according to claim 1, further comprising:
a housing, made of a magnetic substance, configured to contain the first to eighth electrode substrates.

9. The deflector according to claim 1, further comprising:
an electric field shielding wall extending outwards from an entrance hole through which the multiple electron beams enter the space defined by the first to eighth electrode substrates.

10. A multiple beam image acquiring apparatus comprising:
a primary optical system configured to irradiate multiple primary electron beams onto a substrate;
a beam separator configured to separate, from the multiple primary electron beams, multiple secondary electron beams including reflected electrons, emitted from the substrate due to the irradiation with the multiple primary electron beams;
a detector configured to detect the multiple secondary electron beams having been separated; and
a deflector configured to deflect the multiple secondary electron beams having been separated to a range detectable by the detector,
wherein the deflector includes
a first electrode substrate,
second to fourth electrode substrates disposed in order in parallel to each other in a first same plane which is orthogonal to a substrate surface of the first electrode substrate,
a fifth electrode substrate, and
sixth to eighth electrode substrates disposed in order in parallel to each other in a second same plane such that they are opposite to the second to fourth electrode substrates,
wherein the first, second, third, fourth, fifth, sixth, seventh, and eighth electrode substrates are disposed such that they define Surround a space through which the multiple secondary electron beams pass, such that the fifth electrode substrate faces the first electrode substrate across the space.

* * * * *